United States Patent
Mahoney et al.

[19]

[11] Patent Number: 6,086,962
[45] Date of Patent: Jul. 11, 2000

[54] METHOD FOR DEPOSITION OF DIAMOND-LIKE CARBON AND SILICON-DOPED DIAMOND-LIKE CARBON COATINGS FROM A HALL-CURRENT ION SOURCE

[75] Inventors: Leonard Joseph Mahoney, Fort Collins, Colo.; David Ward Brown, Lansdale; Rudolph Hugo Petrmichl, Center Valley, both of Pa.

[73] Assignee: Diamonex, Incorporated, Allentown, Pa.

[21] Appl. No.: 09/243,913

[22] Filed: Feb. 3, 1999

Related U.S. Application Data

[63] Continuation-in-part of application No. 08/901,036, Jul. 25, 1997, Pat. No. 5,973,447.
[51] Int. Cl.[7] ............... H05H 1/24; C23C 16/26
[52] U.S. Cl. .............. 427/577; 427/249.7; 427/523; 427/902; 427/904; 427/571
[58] Field of Search ................... 427/577, 249.7, 427/902, 904, 523, 571

[56] References Cited

U.S. PATENT DOCUMENTS 5,455,081  10/1995  Okada et al. .................. 427/528
5,616,179  4/1997  Baldwin et al. ................ 117/108

*Primary Examiner*—Roy V. King
*Attorney, Agent, or Firm*—Coudert Brothers

[57] ABSTRACT

A unique Hall-Current ion source apparatus is used for direct ion beam deposition of DLC coatings with hardness values greater than 10 GPa and at deposition rates greater than 10 Å per second. This ion source has a unique fluid-cooled anode with a shadowed gap through which ion sources feed gases are introduced while depositing gases are injected into the plasma beam. The shadowed gap provides a well maintained, electrically active area at the anode surface which stays relatively free of non-conductive deposits. The anode discharge region is insulatively sealed to prevent discharges from migrating into the interior of the ion source. A method is described in which a substrate is disposed within a vacuum chamber, coated with a coating of DLC or Si-DLC at a high deposition rate using a Hall-Current ion source operating on carbon-containing or carbon-containing and silicon-containing precursor gases, respectively. The method is particularly advantageous for producing thin, hard, wear resistant DLC and Si-DLC coatings for magnetic transducers and media used for magnetic data storage applications.

58 Claims, 5 Drawing Sheets

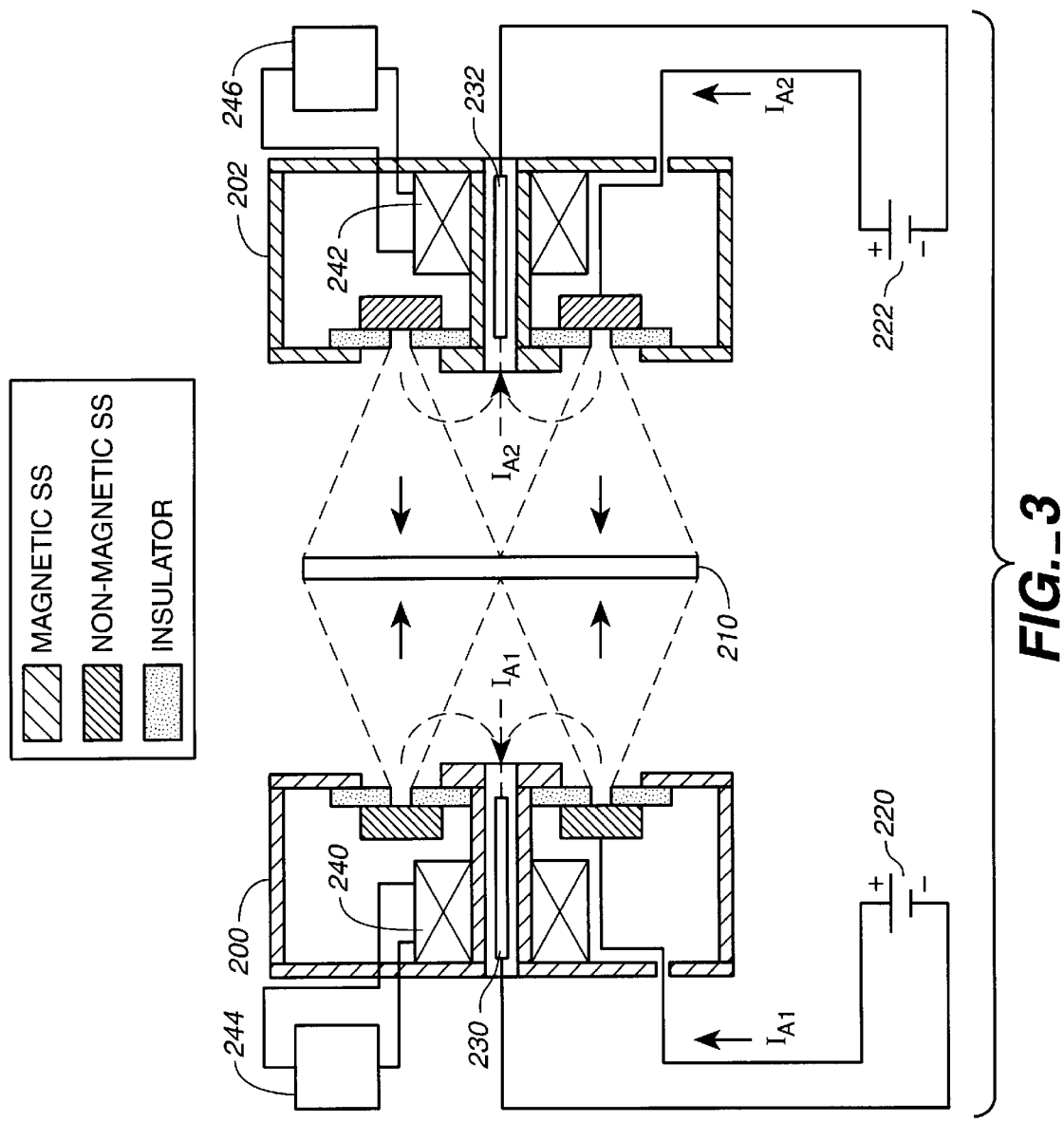
FIG._3

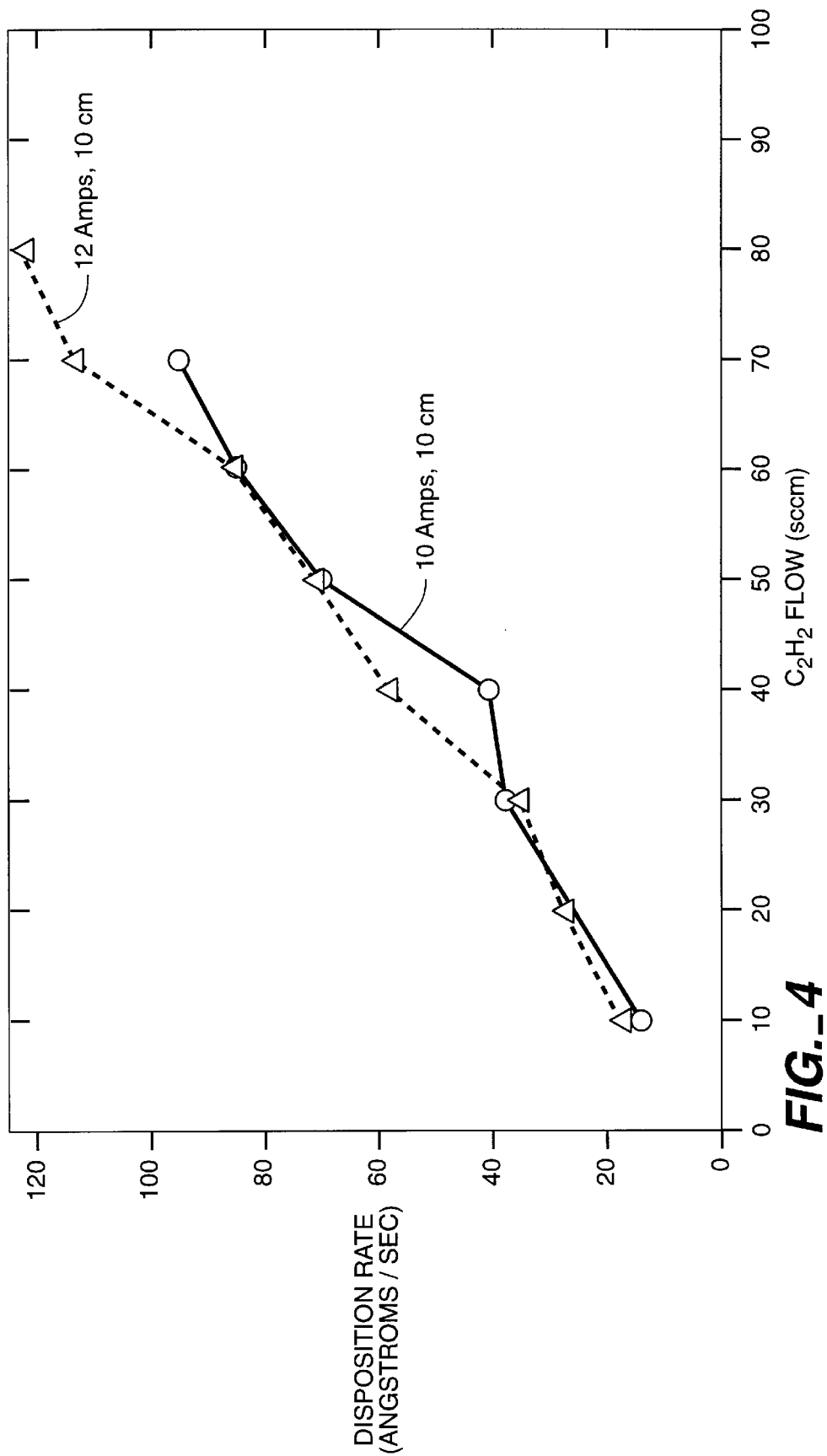
FIG._4

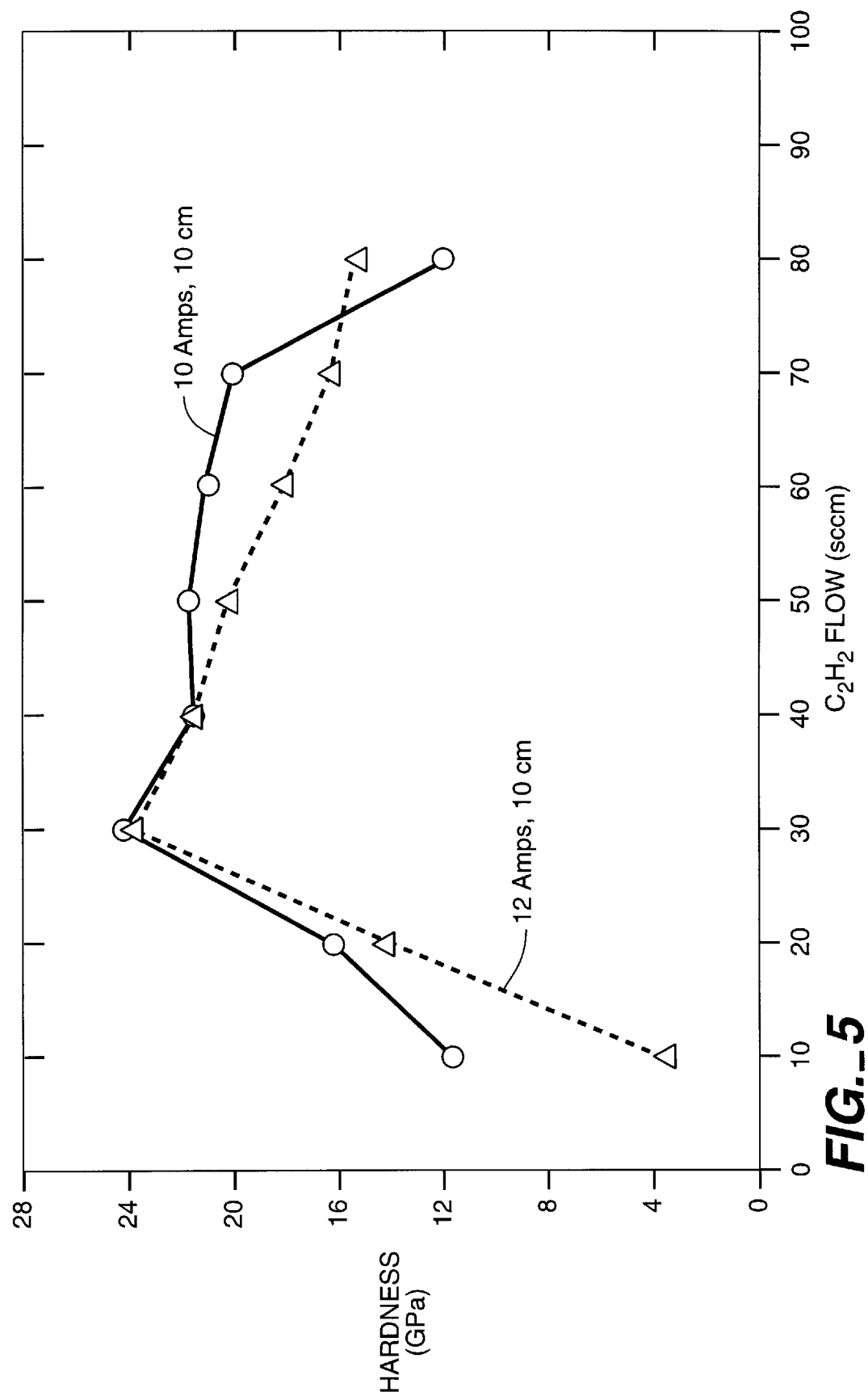
FIG._5

METHOD FOR DEPOSITION OF DIAMOND-LIKE CARBON AND SILICON-DOPED DIAMOND-LIKE CARBON COATINGS FROM A HALL-CURRENT ION SOURCE

This application is a continuation-in-part of application U.S. Ser. No. 08/901,036 filed on Jul. 25, 1997, now U.S. Pat. No. 5,973,447.

FIELD OF THE INVENTION

This invention relates to a method and apparatus for the deposition of thin, hard, wear-resistant diamond-like carbon and silicon-doped diamond-like carbon coatings using gridless Hall-Current ion sources, and the use of the process to produce protective coatings for data storage and other applications.

BACKGROUND OF THE INVENTION

There are numerous examples in the prior art of the application of gridded ion sources to the direct deposition of diamond-like carbon coatings (DLC) from hydrocarbon gases, mixtures of hydrocarbon gases and mixtures of inert gases with hydrocarbon gases within the ion source. Two recent articles help to illustrate state-of-the-art application of gridded ion sources to the deposition of DLC coatings. M. Weiler et al., Applied Physics Letters, Vol. 64, pages 2792–2799 (1994), and Sattle et al., Journal of Applied Physics, Vol. 82, pages 4566–4575 (1997) describe application of a gridded ion source to the direct deposition of DLC using acetylene gas. Their work shows that DLC coatings with high $sp^3$ fraction and with hardness greater than 10 GPa can be deposited at moderate deposition rates up to about 10 Å per second provided that (1) a high degree of ionization of the feed gas is obtained, (2) a high C/H ratio of ion species is formed and (3) the mean energy of the beam provides about 100 eV per C atom deposited from the ion beam. As such, gridded ion sources typically operate with ion energies near 100 to 250 eV in order to form hard (i.e. >10 GPa) DLC coatings.

It is also known that one may produce DLC coatings which incorporate other dopant elements, e.g. silicon. Such coatings are commonly referred to as silicon-doped DLC or Si-DLC. For example, Brown et al., pending patent application U.S. Ser. No. 08/707,188 filed Sep. 3, 1996, disclose a Si-DLC coating for magnetic transducers and magnetic recording media which is deposited by from silicon-containing and carbon-containing precursor gases by a direct ion beam deposition method. These Si-DLC coatings are characterized by the following features: Nanoindentation hardness in the range of about 12 GPa to 19 GPa, compressive stress in the range of about 0.4 GPa to 1.8 GPa, Raman spectral G-peak position in the range of about 1463 $cm^{-1}$ to about 1530 $cm^{-1}$, a silicon concentration in the range of about 1 atomic % to about 30 atomic % and hydrogen concentration of about 25 atomic % to about 47 atomic %. In their examples, a gridded ion source is disclosed as the apparatus to deposit Si-DLC coatings.

However, it is well known that gridded ion sources are limited in DLC and Si-DLC deposition applications by the function of the electrostatic grid optics which are necessary to form near mono-energetic ion beams. In production, such grids limit the beam current density and, thereby, the deposition rates. Also the grids become coated substantially with deposits which eventually disrupt production, limit maintenance cycles, and cause extensive maintenance problems when removing such deposits from the grid optics. Gridded ion sources operate at low vacuum pressures, typically below $5 \times 10^{-4}$ Torr, and typically have ion beam DLC deposition rates of less than 10 Å/sec for most all variety of gaseous hydrocarbon chemistries.

In order to overcome the limitations with gridded ion sources, prior art attempts have been made to use gridless Hall-Current ion sources for the deposition of DLC coatings. In these DC or pulsed-DC devices, ions are accelerated from a region of ion production through an electric field, E, established within the bulk of the discharge near the anode of the apparatus. The electric field is brought about by a static magnetic field, B, imposed on the discharge in the vicinity of an anode wherein the electron drift motion from cathode to anode is impeded by the magnetic field. Electrons emitted from the cathode ionize feed gases as they drift toward the anode through the magnetic field via collisional and anomalous diffusion. The restricted mobility of electrons across the magnetic field lines forms a space-charge near the anode and an electric field that is substantially orthogonal to the imposed magnetic field. Ions generated within the anode discharge region are accelerated away from the anode. Since the anode discharge and ion acceleration regions do not exclude electrons, ion beam current densities are not restricted by space-charge limitations that are inherent in electrostatic acceleration optics. A fraction of the electrons emitted from the cathode and those released within the discharge from ionization also serve to electrically neutralize the ion beam as it propagates away from the anode's ion acceleration region. At pressures above $10^{-4}$ Torr, ionization away from the anode discharge region and charge-exchange processes within the ion beam can form a diffusive background discharge making the output characteristics of the source appear as both an electrically neutralized ion beam and a quasi-neutral diffusive plasma. Unlike the near mono-energetic ion energy distribution of a gridded ion source, this gridless ion source has a broad energy spectrum and is capable of very high ion current densities. The combined output of both a self-neutralized ion beam and diffusive plasma is sometimes referred to as a "plasma beam".

Another characteristic feature of this type of ion source is an E×B drift current motion of electrons in the anode discharge region. Electrons, which spiral about the lines of the magnetic field, experience an E×B or Hall-effect force and collectively drift in a direction perpendicular to both magnetic and electric fields. This is referred to as a Hall-effect drift current. In order to avoid Hall potentials which may form along this electron drift path, these ion sources have anode discharge regions or channels that allow Hall-effect current to drift along a continuous and closed path. The prior art refers to these types of ion sources by many names: "Magneto-plasma-dynamic Arc Thrusters", "Hall Accelerators", "Closed-Drift Thrusters", and "Hall-Current Ion Sources". For the purpose of this disclosure, these devices are referred to, in general, as "Hall-Current ion sources". Yet another version of this technology is the "End-Hall" ion source described by Kaufinan et al., U.S. Pat. No. 4,862,032, issued Aug. 29, 1989.

The following references illustrate the prior art with regard to the application of Hall-Current ion sources to the deposition of DLC coatings.

Okada et al., Japanese Journal of Applied Physics, Vol. 31, pages 1845–1854 (1992), describe a high energy Hall-Current ion source used for ion implantation and deposition of hard, abrasion resistant DLC coatings.

Fedoseev, et al. Diamond and Related Materials, Vol. 4, pages 314–317 (1995), describe a Hall-Current ion source used in deposition of relatively transparent DLC coatings.

Baldwin, et al., U.S. Pat. No. 5,616,179, issued Apr. 1, 1997, describe a process for the deposition of diamond-like, electrically conductive, and electron-emissive carbon-based films and coatings using the End-Hall ion source of the Kaufman et al. '032 patent.

Knapp et al., U.S. Pat. No. 5,508,368, issued Apr. 16, 1996 and Petrmichl et al., U.S. Pat. No. 5,618,619, issued Apr. 8, 1997 describe a process in which an End-Hall ion source or Hall-Current ion source is used to deposit highly transparent coatings comprised of C, Si, O and H, with Nanoindentation hardness of about 2 to 5 GPa, and having abrasion resistance comparable to glass.

It is desirable to deposit DLC and Si-DLC coatings in a production setting on a wide variety of substrates for many applications by direct ion beam deposition with a gridless Hall-Current ion source. More specifically, it is desirable to deposit DLC and Si-DLC coatings from a gridless Hall-Current ion source wherein such coatings have Nanoindentation hardness values greater than 10 GPa and wherein the deposition rates of such coatings are greater that 10 Å per second in a production setting. As an example, it is desirable to produce ultra-thin, e.g. less than 100 Å thick, preferably about 20 Å to 50 Å thick DLC and Si-DLC overcoats with hardness greater than 10 GPa on magnetic transducers and magnetic media used in data storage applications to provide the required tribological performance of the head-disk interface while maintaining very low magnetic spacing. In high volume production, it is desired that the overcoats on magnetic disks be deposited at rates of about 5 to 30 Å per second in order to meet production throughput requirements.

In addition to optimization of the properties of the DLC and Si-DLC, it equally important to be able to apply these coatings in a production environment. Thus, it is necessary that the Hall-Current ion source have the following additional characteristics and capabilities when depositing DLC and Si-DLC coatings:

1) operate at relatively high power and discharge current levels, be relatively insensitive to the nonconductive hydrocarbon coatings that form within the anode discharge region of the ion source,
2) have a beam output that is reliable, consistent and symmetric with respect to the ion source geometry,
3) be free of potentially damaging arcing and other undesirable electrical transient events,
4) be easy to ignite and apply to periodic on-off operation, and
5) be easily scalable to applications involving large surface areas.

Prior art Hall-Current ion sources all suffer from limitations which inhibit their use for the deposition of DLC and Si-DLC coatings in a production environment. None of the prior art references teach how to deposit DLC and Si-DLC coatings with hardness greater than 10 GPa and at deposition rates substantially greater than 10 Å per second. Furthermore, prior art references do not teach how to overcome problems associated with high-rate deposition of nonconductive DLC and Si-DLC coatings in a production environment.

Okada et al., describe the use of a relatively high beam energy (about 200 to 1000 eV) Hall-Current ion source in the deposition of DLC films from methane, but do not discuss the application of the apparatus to Si-DLC coatings. Their bulky and sophisticated device uses many electromagnets to form a magnetic field within its extended acceleration channel. There is no direct, active cooling of the anode assembly and the apparatus is operated at low gas flow rate of a few sccm, and a low anode-to-cathode current near 1 Amp. Using an ion beam energy on the order of 500 eV, the peak Vickers hardness values of coatings deposited from methane at 10 cm downstream of the face of the ion source were high, about 4600 kg/mm$^2$ Vickers hardness with a 10 gram load. However, the deposition rate was on the order of only 1 to 2 Å per second, which is far lower than desired. There is no teaching on how to operate or configure this source to produce DLC or Si-DLC at high deposition rates. Moreover, this type of Hall-Current ion source does not have an independent cathode that generates a self-sustained and continuous emission of electrons. This makes periodic on-off operation difficult in production. As such there are no disclosed reports or embodiments within this extended-channel Hall-Current ion source that suggest that it can deposit high hardness DLC coatings at high rates or that it can address common problems encountered in direct deposition of coatings at high rates.

Fedoseev et al. used a mixture of hydrogen and hydrocarbon feed gases in a Hall Accelerator ion source with a water-cooled anode to produced DLC coatings. Their intent was to produce optically transparent DLC coatings with low levels of light absorption. DLC coatings produced from a feed gas of hydrogen plus methane, ethane and acetylene were deposited on substrates positioned 18 cm from the face of the ion source. Deposition rates ranged from about 2 to 30 Å per second. However, Vickers hardness of the DLC coatings was very low, in the range of 400 to 1,000 kg/mm$^2$ (4 to 10 GPa) measured with a very light load of 5 grams. Further, it is known that the DLC coating hardness is overestimated by the use of such low indenter loads. As such, there is no teaching to suggest how to achieve very high hardness DLC coatings by means of Fedoseev's Hall Accelerator ion source.

Baldwin et al. in the '179 patent describe a process for depositing amorphous or nanophase DLC coatings using an End-Hall ion source. In one embodiment of this process, various hydrocarbon gases in combination with argon are used to deposit DLC coatings at rates as high as about 33 Å per second with hardness of 8 GPa. In their preferred embodiment, Baldwin et al. teach that DLC films are produced by the End-Hall ion source from methane/argon mixtures with an ion energy of about 90 to 100 eV per C atom deposited and a beam current density of about 0.2 A/cm$^2$. No other teachings are presented that suggest how to modify the process conditions or the configuration of the End-Hall ion source so as to enable the deposition of very hard DLC or Si-DLC coatings at high deposition rates.

Knapp et al. and Petrmichl et al., in the '368 and '619 patents, respectively, describe an ion beam deposition method to manufacture a substance with improved abrasion resistance and improved lifetime. In the detailed description of these inventions, examples and preferred embodiments, an End-Hall ion source is operated with hydrocarbon gases including methane and cyclohexane to deposit DLC. These patents primarily focused on the deposition of highly extensible, abrasion resistant coatings with preferred hardness in the range of about 2 to 5 GPa and low compressive stress. Knapp et al. also allude to the application of other types of Hall-Current ion sources (i.e. Hall Accelerator ion sources) for this method, but do not discuss or teach how such alternative gridless ion sources should be designed, configured or operated in order to carry out the disclosed deposition method. As such, there are no teachings which suggest how to apply Hall-Current ion sources to form high hardness DLC or Si-DLC coatings at high rates in production.

Yet other operational shortcomings of prior art Hall-Current ion sources are described by Mahoney et al. in patent application U.S. Ser. No. 08/901,036 filed in Jul. 25, 1997, now U.S. Pat. No. 5,973,447 which description is incorporated herein by reference.

Set forth below is a summary of the shortcomings of the application of prior art Hall-Current ion sources for the deposition of DLC and Si-DLC coatings.

1) Inability to produce DLC coatings with hardness greater than 10 GPa and at a deposition rate greater than 10 Å per second;
2) Inability to operate at relatively high power and discharge current levels for extended periods of time in order to facilitate high deposition rates and beam current fluxes;
3) Operation that is sensitive to the nonconductive hydrocarbon coatings that form within the anode discharge region of the ion source;
4) Ion beam properties that are unreliable, inconsistent in time and spatially asymmetric with respect to the geometry of the ion source apparatus;
5) Susceptible to damaging due to plasma arcs, shorts and other undesirable electrical transient events which inhibit production;
6) Inability to easily ignite and apply to periodic on-off operation;
7) Difficult to scale to applications involving large surface areas or widths.

SUMMARY OF THE INVENTION

The method of the present invention comprises depositing a DLC or a Si-DLC coating onto the surface of a substrate using a Hall-Current ion source. This Hall-Current ion source and its embodiments are described in Mahoney, et al., U.S. Pat. No. 5,973,447, the description of which is incorporated herein by reference. Particularly, the ion source incorporates a non-radiative or fluid-cooled anode that provides a conductive surface area or areas where electron contact current can be sustained continuously and substantially uniformly about the anode when depositing DLC and Si-DLC coatings.

In the initial steps of the method, the substrate is mounted in a deposition vacuum chamber containing the Hall-Current ion source and the air is evacuated from the chamber. An inert gas is supplied to at least one self-sustaining cathode electron source and the electron source is suitably excited by power supply means, i.e. one or more power supplies, to provide a supply of electrons to an anode of the Hall-Current ion source. The anode is electrically insulated from the vacuum chamber in such a manner to prohibit the formation of a plasma migrating into the interior of the Hall-Current ion source behind the anode. Plasma maintenance gases are introduced through a gap of the anode and into an anode discharge region within the vacuum chamber. A voltage is then applied to cause a discharge current to flow between the anode and the electron source. Additionally, a voltage is applied to an electromagnet power supply for electromagnetic means, i.e. a least one electromagnet, of the Hall-Current ion source, causing current to flow through the electromagnet. This results in a magnetic field being formed across the anode discharge region and in electrons ionizing the plasma maintenance gases and forming a plasma beam of gas ions throughout the anode discharge region. A layer of DLC or Si-DLC is plasma ion beam deposited from carbon-containing precursor gases or a mixture of silicon-containing and carbon-containing precursor gases, respectively. During the deposition, the anode is thermally cooled by cooling means other than radiative thermal emission, i.e. by the use of convection coolers or conductive coolers. Preferably, the anode is a fluid-cooled anode. The vacuum chamber pressure is increased to atmospheric pressure and a DLC-coated or Si-DLC-coated substrate product is recovered.

The recovered DLC and Si-DLC coatings have hardness values greater than 10 GPa and are deposited at rates substantially greater than 5 Å/sec, i.e., in the range of about 10 to 120 Å/sec., using the unique Hall-Current ion source. This gridless ion source is a closed path or non-closed path Hall-Current ion source that embodies features which overcome the problems encountered with ion sources of the prior art when applied to the production of DLC coatings.

The precursor gases are introduced either through the gap in the anode, along with the plasma maintenance gases, or directly into the plasma beam and separately from the introduction of the plasma maintenance gases through the gap of the anode. The dimensions of the gap within the anode are at least greater than the characteristic Debye length of a local plasma formed near the gap in the anode. The shape of the gap is configured so as to substantially restrict line-of-sight deposition of coating onto the anode within the gap such that the anode discharge current is substantially maintained at the anode within the gap near a localized region of the plasma maintenance gases passing into the anode discharge region.

This unique Hall-Current ion source comprises:

(a) an insulatively sealed anode to prevent plasma from forming behind the anode;
(b) a non-radiative cooling means for cooling the anode;
(c) a self-sustaining cathode, i.e. a cathode having an independent power supply;
(d) an electromagnet that operates at least partially on either the discharge current from the anode to the self-sustaining cathode or on current from an independent, direct current (DC), periodically reversing or alternating current (AC) source; and
(e) at least one gap within the anode to introduce the plasma maintenance gases through an injector or other injection means.

In its application to DLC coating deposition, the Hall-Current ion source apparatus may be configured with either a closed or non-closed Hall-Current drift path region. The non-closed Hall-Current ion source uses a periodically reversing or alternating magnetic field in order to form a plasma beam whose spatial time-averaged output is symmetric with respect to the geometry and scale of the ion source. This non-closed Hall-Current ion source is particularly useful in depositing DLC and Si-DLC coatings onto wide surfaces and substrates.

It has been found that when the DLC or Si-DLC process produces highly insulating deposits on the anode region of the Hall-Current ion source, operating the electromagnet partially on either the discharge current from the anode to the self- sustaining cathode, or on the current from an independent, periodically reversing or alternating current source is preferred over a direct current source. However, it has been found that for certain process conditions which result in weakly insulating or conducting deposits on the anode region, e.g. using acetylene precursor gas, it is possible to operate the Hall-Current source in a stable manner using a direct current source for the electromagnet.

By introducing the precursor gases (with or without nonreactive maintenance gases) completely or in part into the anode discharge region of this Hall-Current ion source, it is possible to deposit DLC coatings at rates in the range of about 10 to about 200 Å per second, with hardness in the range of about 10 GPa to about 40 GPa and compressive stress in the range of about 0.5 GPa to 8 GPa, and Si-DLC coatings at rates in the range of about 5 to about 200 Å per second, with hardness in the range of about 10 GPa to about 40 GPa, compressive stress in the range of about 0.5 GPa to about 6 GPa, and silicon concentration in the range of about 2 to about 48 atomic percent. Also with the operation of the unique Hall-Current ion source at high beam current densities, it is possible to deposit unexpectedly hard DLC coatings at surprisingly low time-averaged ion energies, i.e. less than 40 eV, using various hydrocarbon feed gases.

BRIEF DESCRIPTION OF THE DRAWING

FIG. 3 is a diagrammatic illustration of the application of the present invention wherein two Hall-Current ion sources are used to deposit DLC and Si-DLC coatings on the front side and back side of a substrate;

FIG. 4 presents plots of deposition rate versus acetylene precursor gas flow rate at two anode currents for DLC coatings deposited by the process of the present invention; and FIG. 5 presents plots of Nanoindentation hardness versus acetylene precursor gas flow rate at two anode currents for DLC coatings deposited by the process of the present invention.

DETAILED DESCRIPTION OF THE INVENTION

Figure 1:
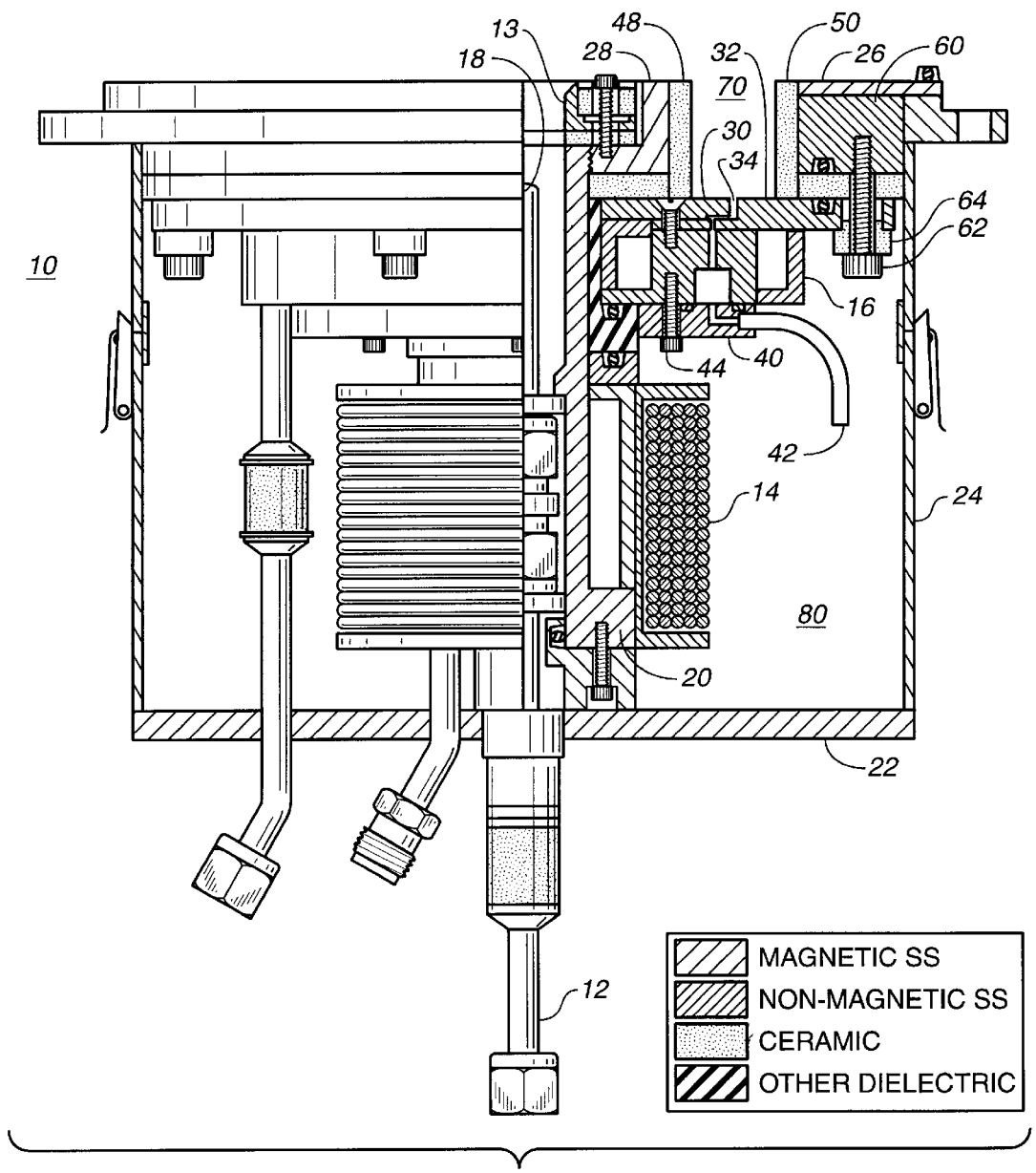
FIG. 1 is a diagrammatic cross-sectional view of an embodiment of the Hall-Current ion source including a self-sustaining cathode devised for vacuum flange mounting.

A detailed description of the Hall-Current ion source of the present invention, its operation, and embodiments are set forth in U.S. Pat. No. 5,973,447, the detailed description of which is incorporated herein by reference. FIG. 1 illustrates one particular axisymmetric embodiment of the Hall-Current ion source. The apparatus 10 is comprised of the basic components of the closed path Hall-Current ion source apparatus. Hall-Current ion source 10 comprises cathode assembly 12, keeper assembly 13, magnetic field circuit assembly and electromagnet 14, anode assembly 16, and separate power supply means (not shown) for supplying a voltage to drive cathode electron emitter source 18 and power supply means (not shown) to drive anode 16 and electromagnet 14. The magnetic field circuit which is comprised of a water-cooled magnetic core assembly 20, back plate 22, outer shell 24, outer pole plate 26 and inner pole piece 28 is driven by electromagnet 14 positioned within the center of cylindrical ion source housing assembly 10. The power supply means supplies DC, AC, RF, pulsed voltage wave forms or combinations of such voltage wave forms, although, DC and pulsed-DC are conventionally used.

The nonmagnetic stainless steel anode assembly 16 comprises inner anode ring 30 and outer anode ring 32, gap 34 defined by the alignment of rings 30 and 32, gas distribution manifold or injection ring 40 supplied by an electrically isolated gas feed line 42. Several gas injection holes are sized and spaced so as to uniformly distribute gas from manifold 40 into gap 34. Anode 16 also includes two water cooling channels. Anode assembly 16 is held together by two circular arrays of fasteners, e.g., shoulder screws 44 and is isolated from the magnetic circuit assembly by inner insulator rings 48 and outer insulators 50, which are typically made of high temperature ceramic. Anode assembly 16 is attached to the underside of flange assembly 60 by several fasteners 62 and insulators 64. In order to seal the acceleration channel 70, the fit and finish of surfaces between pole 28, insulator rings 48 and ring 30, and between pole 26, insulator rings 50 and ring 32 have sufficient fit and finish so as to prohibit diffusion of plasma into the interior regions 80 of ion source housing 10.

Novel aspects of this Hall-Current ion source that provide unique capabilities relevant to the ion beam deposition of DLC and Si-DLC coatings include:

(a) an anode discharge region for the formation and acceleration of a plasma beam;

(b) an insulatively sealed anode to prevent plasma from forming behind the anode;

(c) a non-radiative cooling means for cooling the anode;

(d) a self-sustaining cathode, i.e. a cathode having an independent power supply;

(e) an electromagnet that operates at least partially on either the discharge current from the anode to the self-sustaining cathode or current from an independent, DC, periodically reversing current or AC; and (f) a gap within the anode to introduce plasma maintenance gases or working gases.

Additional unique features, capabilities and embodiments of the Hall-current ion source are described by Mahoney et al. in co-pending patent application U.S. Ser. No. 08/901, 036, filed on Jul. 25, 1997.

The advantageous features of this Hall-Current ion source make it well suited to the deposition of DLC coatings from carbon-containing precursor gases and Si-DLC coatings from silicon-containing and carbon-containing precursor gases. Moreover, its application results in unexpectedly high rates of deposition of very hard DLC and Si-DLC coatings even when the ion beam energies are substantially lower than previously believed necessary to synthesize hard DLC and Si-DLC coatings. Using this Hall-Current ion source, ion beam DLC and Si-DLC coatings with hardness values ranging from about 10 to 40 GPa are possible with mean ion energies ranging from about 40 to 100 eV at deposition rates that range from about 5 to 200 Å per second.

For the deposition of DLC coatings by the method of the present invention, the precursor feed gas mixture is made up of carbon-containing compounds including, but not limited to linear or cyclic hydrocarbon compounds such as methane, ethane, ethylene, butadiene, acetylene, hexane, and cyclohexane which may be mixed with inert gases including but not limited to argon, neon, helium, xenon, krypton, and mixtures thereof. Furthermore, to further modify the properties of the DLC film, reactive gases including, but not limited to hydrogen, nitrogen, nitrogen-containing compounds, fluorine-containing compounds, and mixtures thereof may be added to the ion source feed gas.

For deposition of Si-DLC coatings by the method of the present invention, the precursor feed gas mixture is made up of silicon-containing and carbon-containing compounds including, but not limited to silane compounds such as silane, disilane, and organosilane compounds such as methylsilane, dimethylsilane, trimethylsilane, tetramethylsilane (TMS), diethylsilane (DES) which may be mixed with hydrocarbon compounds including, but not limited to methane, ethane, ethylene, butane, butadiene, hexane, cyclohexane, and mixtures thereof and inert gases such as argon, helium, xenon, krypton, and mixtures thereof. Furthermore, reactive gases such as including, but not limited to hydrogen, nitrogen, and nitrogen-containing compounds or fluorine-containing compounds or mixtures thereof may be added to the precursor gas stream to modify the properties of the deposited Si-DLC coating. A critical feature is that a silicon-containing precursor gas is introduced into the ion beam source to provide the silicon doping level in the Si-DLC coatings which is required to obtain excellent adhesion and tribological performance of the Si-DLC coatings of the present invention.

Figure 2:
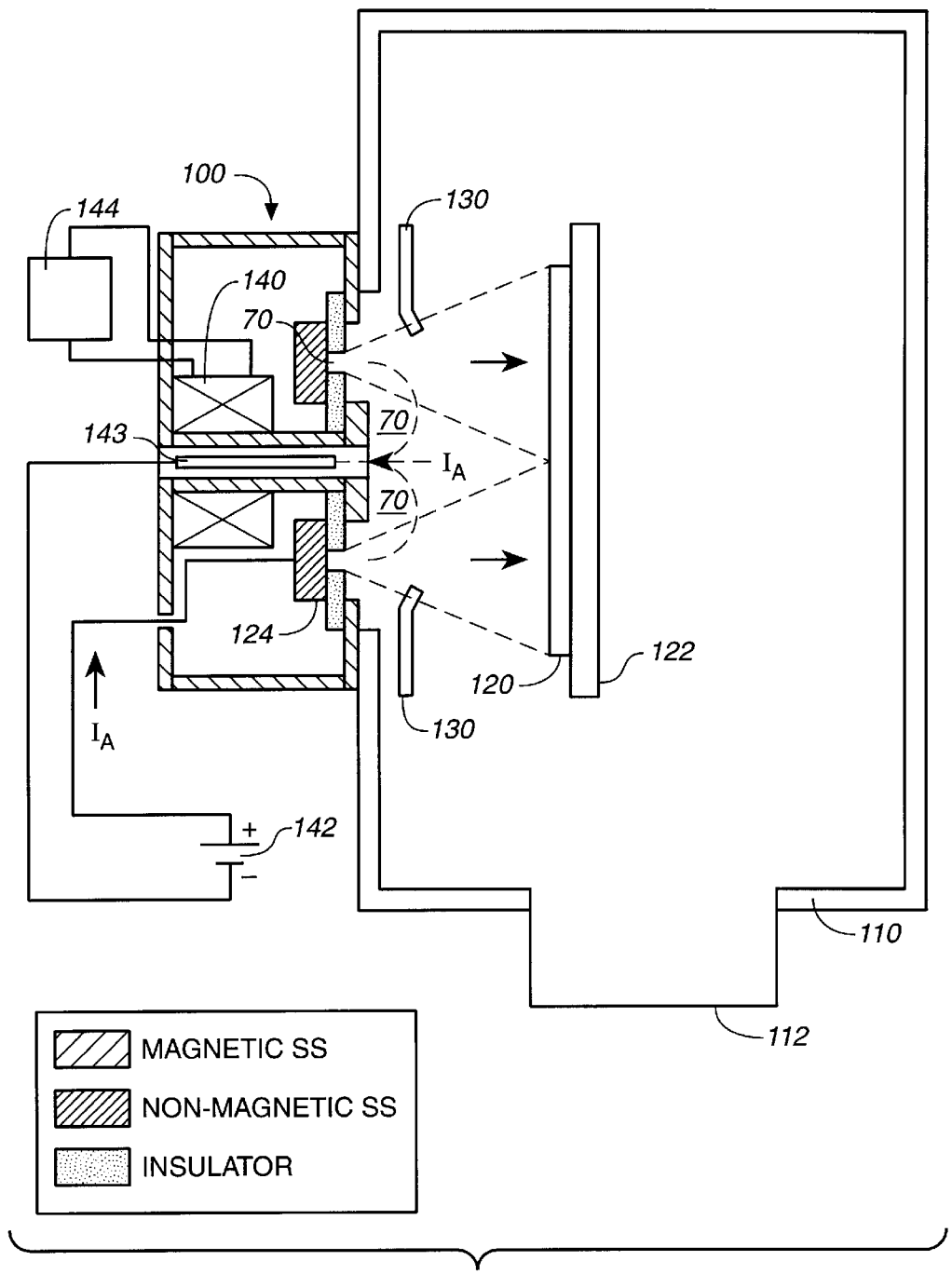
FIG. 2 is a diagrammatic illustration of the application of the present invention wherein a Hall-Current ion source is used to deposit DLC and Si-DLC coatings on the surface of a substrate.

The following describes the application of the Hall-Current ion source to high rate deposition of high hardness DLC and Si-DLC coatings. FIG. 2 shows a closed-path Hall-Current ion source 100 with a nominal anode diameter of 7.6 cm and which is similar to that depicted in FIG. 1. In FIG. 2, the ion source is shown attached to vacuum chamber 110. The attachment may be made by a conventional vacuum flange or other mounting means (not shown) which are well known in the art. Ion source 100 may also be mounted internally within the vacuum chamber (not shown) using mounting means which are well known in the art. Vacuum chamber 110 is pumped via port 112 to low pressures, e.g. less than 10 mTorr. The ion source is directed at substrate(s) 120 supported by or mounted to process fixture(s) 122. Plasma maintenance gases such as inert gases including, but not limited to, argon, krypton and xenon are introduced into the anode discharge region 70 through anode 124. Precursor gases for the deposition of DLC or Si-DLC are introduced either along with the plasma maintenance gas through the anode or separately near the open end of the anode discharge region via a gas manifold or one or more nozzles 130. Electromagnet 140 of the Hall-Current ion source is driven either fully or in part by the anode current $I_A$ from power supply 142, which powers self-sustained cathode 143, or alternatively, as shown in FIG. 2, by an independent AC or DC current source 144 in order to from a magnetic field within the anode discharge region 70. When the AC electromagnet configuration is used, the anode current and anode voltages are modulated, and, in turn, the beam current and mean ion energy is modulated. Under typical operating conditions, the rms (root-mean-squared) anode potential ranges from 50 to 150 V and the rms anode current $I_A$ ranges from 3 to 15 Amps. Time-averaged mean beam energies from this type of Hall-Current ion source are typically about 0.3 to 0.6 times the rms value of the anode potential (or about 20 to 100 eV) and time-averaged total beam currents are typically about 0.1 to 0.4 times the rms value of the anode discharge current $I_A$ (or about 0.3 to 7 Amps).

Also more than one Hall-Current ion source may be utilized for coating deposition. FIG. 3 illustrates two Hall-Current ion sources 200 and 202 with features similar to those of FIG. 1 which are arranged to treat both sides of workpiece 210. In this case, the Hall-Current ion sources are independently powered by power supplies 220 and 222 and each have their own self-sustained cathode 230 and 232. Also, each ion source electromagnet 240 and 242 are driven by separate AC power supplies 244 and 246. This dual-sided configuration is particularly useful in treating or coating both sides of substrate or fixture 210 simultaneously. One example of the utility of this configuration is in the deposition of DLC and Si-DLC coatings simultaneously on both sides of magnetic disks. Within the scope of the application of the present invention, the substrate may consist of metal, a semiconductor, ceramic, glass, polymers, or combination thereof that may or may not include an adhesion-enhancing interlayer for the DLC or Si-DLC coating. For those applications in which an adhesion layer is desired, such a layer may be deposited by the Hall-Current ion source apparatus or by any conventional alternative means within or outside the vacuum chamber prior to deposition of the DLC or Si-DLC coating.

The process for deposition of the DLC or Si-DLC coating is principally controlled by a combination of (1) source-to-substrate spacing and orientation, (2) anode current, voltage or power, (3) electromagnet current or the amp-turns within the electromagnet, (4) plasma maintenance gas flow, (5) precursor gas composition, and (6) precursor gas flow rate. Typically the anode current and anode voltages are not independent when conventional hollow cathode electron sources are used. However, anode current and potential can be decoupled by using hot filament-assisted hollow cathode electron sources, such as that described by Fedoseev et al. With a fixed anode current setting, electron emission from this type of cathode may be used to control anode voltage (power) independently through the control of cathode electron injection into anode discharge region against the rate of charged particle generation within the anode discharge region.

EXAMPLES

The examples which follow illustrate the process for the deposition of DLC and Si-DLC coatings using the Hall-Current ion source of the present invention. The examples are for illustrative purposes only and are not meant to limit the scope of the claims in any way.

The following operating conditions were established or measures taken in carrying out Examples A–E:

(a) A Hall-Current ion source similar to that depicted in FIG. 2 was fully immersed within a diffusion-pumped high vacuum deposition chamber.

(b) Substrates such as silicon wafers and metal disks were positioned a predetermined distance from the face of the ion source on a rotating plate or barrel such that they could be rotated into the ion beam, statically positioned for a predetermined period of time and then rotated out of the ion beam. The face of the samples were perpendicular to and centered with respect to the ion source axis during deposition.

(c) The vacuum chamber was evacuated to a pressure below $10^{-5}$ Torr prior to starting the deposition process.

(d) The hollow cathode of the ion source was ignited and adjusted to steady-state operation with about 15 sccm of Ar and about 1 to 3 Amps of keeper-to-cathode current.

(e) Gases were introduced into the ion source and the anode discharge of the ion source was started to carry out sample surface precleaning (using Ar gas), interlayer deposition, DLC deposition, Si-DLC deposition, or a combination thereof (f) Upon completion of the deposition, the anode discharge and hollow cathode discharge was turned off, the vacuum chamber pressure was increased to atmospheric pressure and the samples were recovered with a DLC or Si-DLC coating.

Thickness and deposition rate of DLC and Si-DLC coatings were determined from profilometry measurements performed on a Tencor P-10 Profilometer. Stress measurements were determined from films on 100 mm diameter Si stress wafers by means of a Frontier Semiconductor Measurements FSM 8800 Film Stress Measurement Machine. Measurements of Nanoindentation hardness were taken by a Nano Instruments Inc. Nanoindenter II on DLC and Si-DLC coatings with thickness greater than about 2500 Å.

Example A

A Hall-Current ion source similar to that depicted in FIG. 1 with nominal anode gap diameter of 7.6 cm was used to deposit DLC coatings. The electromagnet of the ion source was powered by means of the anode discharge current. For each process condition tested, a 100 mm diameter silicon wafer substrate was located 18 cm from the face of the ion source. Prior to deposition the Si sample surfaces were sputter-cleaned using a beam of argon ions generated by a secondary ion source before being rotated into the beam of the depositing ion source.

DLC coatings were deposited by operating the ion source with argon and methane gases. Argon plasma maintenance gas was introduced through the anode gap of the ion source at flow rates from about 20 to 40 sccm. Methane precursor gas was introduced at total flow rates from about 60 to 100 sccm, and equally distributed through four 0.64 cm o.d. metal nozzles that were symmetrically disposed about the outer diameter of anode discharge region and at about 1 cm from the face of the ion source.

During the DLC deposition process, vacuum pressures ranged from about 0.4 to 0.8 mTorr, the anode currents of ranged from about 7 to 9 Amps, and the anode voltage from about 120 to 150 Volts. Profilometry measurements indicated that the average deposition rates for the DLC coatings were in the range of 14 to 20 A per second. The compressive stress and Nanoindentation hardness of the DLC coatings were in the range of about 1 to $1.5 \times 10^{10}$ dynes/cm$^2$, and about 12 to 14 GPa, respectively.

Example B

The same Hall-Current ion source used in Example A was used to deposit DLC coatings by operating the ion source with argon and acetylene gases. In this example, however, the electromagnet of the ion source was powered by means of an AC power supply.

Prior to deposition, a 100 to 200 Å thick layer of Si-DLC was deposited as an adhesion-enhancing interlayer prior to deposition of the 2500 to 5000 Å thick, highly stressed DLC coatings. The thin layer of Si-DLC was deposited by flowing tetramethylsilane precursor gas through the nozzles. For the DLC deposition process, argon plasma maintenance gas was introduced through the anode gap of the ion source at flow rates from 15 to 25 sccm, and acetylene precursor gas was introduced through the nozzles at total flow rates from 40 to 80 sccm.

During the DLC deposition process, vacuum pressures ranged from about 0.4 to 0.8 mTorr, the rms anode current levels of ranged from 5 to 11 Amps, and the anode voltage from 60 to 100 Volts. Profilometry measurements indicated that the average deposition rates for the DLC coatings were in the range of 8 to 23 A per second. The compressive stress and Nanoindentation hardness of the DLC coatings were in the range of about 0.4 to $3.8 \times 10^{10}$ dynes/cm$^2$, and about 11 to 22 GPa, respectively.

Example C

The same Hall-Current ion source configuration used in Example A was used to deposit DLC coatings by operating the ion source with argon and 1,3-butadiene gases. As in Example B, the electromagnet of the ion source was powered by means of an AC power supply.

Also as in Example B, a 100 to 200 Å thick layer of Si-DLC was deposited as an adhesion-enhancing interlayer prior to deposition of the highly stressed DLC coatings. For the DLC deposition process, argon plasma maintenance gas was introduced through the anode gap of the ion source at flow rates from 15 to 25 sccm, and butadiene precursor gas was introduced through the nozzles at total flow rates from 30 to 60 sccm. During the DLC deposition process, vacuum pressures ranged from about 0.4 to 0.8 mTorr, the rms anode current levels of ranged from 5 to 11 Amps and the anode voltage from 60 to 100 Volts. Profilometry measurements indicated that the average deposition rates for the DLC coatings were in the range of 10 to 19 Å per second. The compressive stress and Nanoindentation hardness of the DLC coatings were in the range of about 0.7 to $2.7 \times 10^{10}$ dynes/cm$^2$, and about 10 to 18 GPa, respectively.

Example D

The same Hall-Current ion source used in Example B was used to deposit DLC coatings by operating the ion source with argon and acetylene gases. In this example, however, the Si wafer substrates were located at distances of about 10 cm and about 18 cm from the face of the ion source.

For the DLC deposition process, argon plasma maintenance gas was introduced through the anode gap of the ion source at flow rate of 50 sccm, and acetylene precursor gas was introduced through the nozzles at total flow rates from 10 to 80 sccm. During the DLC deposition process, vacuum pressures ranged from about 0.5 to 0.7 mTorr, the rms anode current levels of ranged from 10 to 12 Amps and the anode voltage from 60 to 100 Volts. Profilometry measurements indicated that the average deposition rates for the DLC coatings were in the range of 13 to 120 Å per second. The compressive stress and Nanoindentation hardness of the DLC coatings were in the range of about 0.3 to $4.5 \times 10^{10}$ dynes/cm$^2$, and about 2 to 25 GPa, respectively.

The DLC deposition rate and Nanoindentation hardness as a function of acetylene precursor gas flow rate (10 to 80 sccm) for anode currents of 10 Amps and 12 Amps and a source-to-substrate distance of 10 cm are presented in FIG. 4 and FIG. 5, respectively.

Example E

This example illustrates the deposition of a layer of Si-DLC using the Hall-Current ion source. In this Example, the Si-DLC material was utilized as an adhesion-enhancing interlayer between the substrate and a top coating layer of DLC. This multilayer coating process has been demonstrated to produce highly adherent thick DLC coatings using the Hall-Current ion source, which DLC coatings have a compressive stress in the range of about $1 \times 10^{10}$ to $4 \times 10^{10}$ dynes/cm$^2$.

The same Hall-Current ion source used in Example A was used to deposit Si-DLC and DLC coatings by operating the ion source with argon, tetramethylsilane (TMS) and acetylene gases. During coating deposition, argon plasma maintenance gas was introduced through the anode gap of the deposition ion source, and the precursor gases (TMS and acetylene) were introduced via nozzles as in Example A. The electromagnet of the ion source was powered by means of an AC power supply. For each process condition tested, a 100 mm diameter silicon wafer substrate was located about 18 cm from the face of the ion source. Prior to deposition the Si sample surfaces were sputter-cleaned by a secondary ion source before being rotated into the beam of the depositing ion source. Three coating layers were deposited to comprise the multilayer DLC coating: (1) a first Si-DLC coating interlayer having the highest atomic concentration of Si, (2) a second Si-DLC coating interlayer having a low atomic concentration of Si, and (3) a top coating layer of DLC. Some coatings were attempted without a Si-DLC adhesion layer, i.e. only step (3) was performed.

For the first Si-DLC coating layer, the flow rate of Ar plasma maintenance gas through the anode was 18 sccm, and the flow rate of TMS precursor gas through the nozzles was 7 sccm. The vacuum chamber pressure was about 0.3 mTorr, the rms anode currents ranged from 9 to 11 Amps, and the rms anode voltage ranged from about 80 to 90 Volts. The deposition time for the first layer of Si-DLC was about 30 seconds.

For the second Si-DLC coating interlayer, the flow rate of Ar plasma maintenance gas through the anode was 18 sccm, and the precursor gas feed was comprised of 7 sccm of TMS plus 60 sccm of acetylene. The vacuum chamber pressure was about 0.7 mTorr, the rms anode currents ranged from 9 to 11 Amps, and the rms anode voltage ranged from about 70 to 80 Volts. The deposition time for the first layer of Si-DLC was about 15 seconds.

For the DLC top layer, the flow rate of Ar plasma maintenance gas through the anode was 18 sccm, and the precursor gas feed was 60 sccm of acetylene. The vacuum chamber pressure was about 0.4 mTorr, the rms anode currents ranged from 9 to 11 Amps, and the rms anode voltage ranged from about 80 to 90 Volts. The deposition time for the first layer of Si-DLC was about 140 seconds.

DLC coatings prepared with only step (3), i.e. without the Si-DLC interlayers, did not adhere well to the silicon substrates as indicated by a tape pull dry adhesion test and isopropyl alcohol wipe test. In fact, areas of these coatings began to delaminate before removing the specimen from the vacuum chamber. However, all coatings prepared by steps (1) through (3) passed the tape pull and isopropyl alcohol wipe tests for adhesion. Profilometry measurements indicated that the average deposition rate of the composite DLC coatings ranged from 12 to 18 Å per second.

Example F

This example illustrates the deposition of a single layer of Si-DLC using the Hall-Current ion source. In this case, the required characteristics of the coating are provided by the Si-DLC coating alone, with the need for deposition of a top layer of DLC.

The same Hall-Current ion source used in Example B was used to deposit Si-DLC coatings by operating the ion source with argon and TMS gases. In this example, however, the 100 mm diameter Si wafer substrates were located at a distance of about 10 cm from the face of the ion source.

Prior to deposition the Si sample surfaces were sputter-cleaned by Ar ion beam etching using the Hall-Current ion source operated on Ar gas only.

For the Si-DLC deposition process, argon plasma maintenance gases were introduced through the anode gap of the ion source at flow rate of 50 sccm, and TMS precursor gas was introduced through the nozzles at total flow rate of 7 sccm. The vacuum chamber pressure was about 0.5 mTorr, the rms anode currents ranged from 7 to 10 Amps, and the rms anode voltage ranged from about 50 to about 75 Volts. The deposition times for the Si-DLC coatings were in the range of about 240 to 300 seconds.

Profilometry measurements of the Si-DLC coatings indicated a coating thicknesses in the range of 1900 to 2100 Å, with average deposition rates ranging from about 12 to 16 Å per second. The compressive stress and Nanoindentation hardness of the Si-DLC coatings were in the range of about 2.0 to $2.3 \times 10^{10}$ dynes/cm$^2$, and about 17 to 18 GPa, respectively, for the conditions studied.

Examples G–K present the results of a series of experiments in which a closed-drift Hall-Current ion source of the present invention was utilized to produce DLC coatings for application on magnetic hard disks used in magnetic data storage. These examples illustrate that the process of the present invention is capable of depositing very thin, protective DLC coatings which have excellent tribological properties onto the surface of magnetic hard disks.

Example L demonstrates an embodiment for producing DLC coatings of extremely high hardness using a closed-drift Hall-Current ion source of the present invention.

Example M demonstrates another embodiment of the present invention in which a non-closed drift Hall-Current ion source of the present invention having an anode channel of rectangular cross-section is used to deposit DLC coatings. This ion source configuration is suitable for depositing DLC coatings on magnetic hard disks in large in-line deposition systems in which large pallets of disks are continuously passed in front of the ion source. The ion source is suitable for deposition of DLC and Si-DLC onto large area substrates such as sheets of plastic, glass or metal, or other large substrates as well.

The examples further show that the process of the present invention can deposit DLC coatings onto magnetic hard disks at a high deposition rate suitable for mass production in two modes. In the "pass-by deposition mode" as illustrated in Example I, substrates are coated as they are continuously passed through the carbon-containing plasma ion beam generated by a continuously operating Hall-Current ion source. Alternatively, in the so-called "pulsed static deposition mode" as illustrated in Examples H and J, individual substrates are coated one at a time as they are sequentially moved in front of the ion source. In this pulsed static deposition mode, the deposition flux is pulsed on after the substrate has been positioned in front of the ion source, the deposition flux is pulsed off after the deposition of the appropriate thickness of the DLC coating, then the substrate is removed from the DLC deposition zone.

Operation in this pulsed mode is industrially important because it is allows the utilization of the ion source and process of the present invention for deposition of DLC and Si-DLC coatings in so-called "static" single disk processing systems for the manufacture of magnetic hard disks. This pulsed mode of deposition for DLC and Si-DLC could also be utilized in other important industrial thin film processing equipment such as cluster tools for wafer processing in the electronics industry.

In Examples G, H, I and J, the precursor gas flow was introduced into the plasma beam in front of the ion source via nozzles made of metal tubing. Three nozzle configurations were used in the experiments. In the first nozzle configuration, four nozzle tubes, oriented in a plane parallel to and approximately 0.25 inch downstream of the face of the ion source were used. The nozzles were oriented 90 degrees from each other and pointed radially inward toward the center of the ion source. The end of each nozzle was located approximately 0.25 inch from the outer diameter of the annular anode channel. This position is noted as the "IN" position in data Tables 1–4 below. The second nozzle configuration was similar to the first, except that the end of each nozzle was located approximately 1 inch from the outer diameter of the annular anode channel. This position is noted as the "OUT" position in data Tables 1–5 below. The third nozzle configuration was similar to the first, except that the nozzles were oriented to deliver the flow of precursor gas across the discharge zone, in a direction along a line tangential to the circle describing the center of the annular anode. This position is noted as the "SIDE" position in Table 1. In all these experiments, the hydrocarbon precursor gas flow was split equally among each of the four nozzles.

The vacuum chamber was pumped down to approximately $1 \times 10^{-5}$ Torr or less prior to initiating the DLC deposition process.

Depending on the amount of available pumping capacity and the desired deposition rate, precursor gas flows ranging from about 2 sccm to about 500 sccm can be used with the ion source of Example B. Higher precursor gas flows increase the background pressure in the deposition chamber. Larger pumping capacity allows higher gas flows to be used while maintaining the total pressure below the desired maximum pressure of about 10 milliTorr.

Argon plasma maintenance gas was fed through the source for all the deposition runs. It was determined that the sum of the argon flow and the hydrocarbon precursor gas flow needed to be above approximately 35 sccm for optimal operation of the particular ion source used in Examples G, H, I and J. This minimum flow is dependent on the ion source operating parameters as well as the background pressure which is controlled by pumping capacity.

The vacuum chamber pressure during DLC deposition was measured with a capacitance manometer. The indicated pressure as presented in data Tables 1–4 was about 0.5 milliTorr higher when the ion source plasma was turned off, indicating a significant amount of consumption of the hydrocarbon precursor gas by the deposition process. The deposition chamber used for the experiments had the capability to throttle the speed of the high vacuum pump, allowing for a comparison of results obtained at similar gas flow rates, but different chamber pressures.

The deposition tests were conducted using anode currents (ion source plasma discharge current) which range was smaller than the total operating range of the ion source. The anode power supply was run in the current control mode, such that the anode voltage would automatically stabilize at the value required to achieve the desired anode current setting. The resulting anode voltage for a particular anode current setting was a function of the gas flow rate, chamber pressure, nozzle position, the magnetic field in the plasma region of the ion source, and geometrical arrangement of the ion source, substrate, and the vacuum chamber.

The magnetic field within the ion source was induced by an electromagnet, which was operated with an independent 60 Hz AC current supply.

Examples G, H, I and J utilized the following range of process parameters for the deposition of DLC coatings:

(a) anode current of 5 to 12 Amps;
(b) anode voltage of 51 to 97 Volts;
(c) chamber pressure of 0.29 to 1.43 milliTorr;
(d) magnet current of 0.8 to 10 Amps;
(e) magnetic field of 16 to 260 Gauss;
(f) hydrocarbon precursor gas flow rate of 20 to 60 sccm;
(g) argon plasma maintenance gas flow rate of 11 to 140 sccm;
(h) distance between front of ion source and substrate of 4 to 14 inches. Note that the range of process parameters used in these examples is smaller than the total operating range of the Hall-Current ion source of the present invention.

For actual use in high density magnetic storage, the desired thickness of the ion beam deposited DLC coating is in the range of about 20 Å to 100 Å. However, for ease of Raman spectroscopy characterization of the DLC material while maintaining good adhesion of the DLC coatings to the magnetic disk substrates, the thickness of the DLC coating on the magnetic disks was often made thicker, up to about 800 Å. DLC coatings having thickness up to 7100 Å were deposited on silicon wafers for measurement of mechanical properties such as compressive stress and Nanoindentation hardness.

In Examples G and H, the deposited DLC coatings were characterized by Nanoindentation hardness of greater than 10 GPa, compressive stress greater than 0.5 GPa, and Raman G-peak position greater than 1500 cm$^{-1}$, and Raman background (luminescence) slope generally greater than 1.

In Examples I, J and K, the thin DLC coatings on magnetic disks were tested for tribological performance using industry standard contact-start-stop (CSS) tests. Prior to the CSS tests, a thin layer of lubricant was applied to the DLC-coated disk surface. Two types of CSS test conditions were employed. The first test condition used ambient conditions of approximately 20° C. to 25° C. room temperature and 30% to 50% relative humidity. The second type of CSS test used conditions known to be very aggressive for magnetron sputtered carbon coatings: elevated temperature of 55° C. and 5% relative humidity. The friction coefficient of the DLC coating was measured before and after each test.

It is widely recognized that industry standard magnetron sputtered carbon coatings of thickness in the range of about 50 Å typically fail at less than 10,000 CSS cycles at ambient conditions, and never survive 20,000 CSS cycles at ambient conditions. It is also recognized that the performance of industry standard magnetron sputtered carbon coatings is much worse under CSS test conditions of elevated temperature and reduced relative humidity than under ambient CSS test conditions.

Based on the known performance of magnetron sputtered carbon coatings, it was determined that if 50 Å thick ion beam DLC coatings passed 20,000 CSS cycles at ambient conditions, and 10,000 CSS cycles at elevated temperature and low humidity conditions, unexpected and outstanding performance, far in excess of what has been achieved with sputtered carbon, would be verified. Therefore, the CSS tests on the ion beam DLC coatings were set to stop at failure or 20,000 CSS test cycles at ambient conditions, and at failure or 10,000 CSS test cycles at elevated temperature and low humidity conditions.

Example G

DLC coatings were deposited onto Si wafers and magnetic hard disks with the Hall-Current ion source of Example B using acetylene or 1,3-butadiene as the hydrocarbon precursor gas. A matrix of deposition runs was designed to examine the effect of ion source process parameters on the resulting DLC material properties. The thickness of the DLC coatings was chosen to be in the range of about 2700 Å to 7100 Å, which was optimum for characterization of mechanical properties such as compressive stress and Nanoindentation hardness.

In these experiments, up to twelve substrates including 4-inch diameter silicon wafers and 95 mm diameter magnetic hard disks were loaded onto a rotatable fixture inside the vacuum chamber. The surface of the magnetic disk substrates was a magnetic recording alloy with no previous carbon coating. Each substrate was coated individually at a specified deposition condition.

In the setup position with no substrate in front of the ion source, the ion source plasma was first stabilized for several minutes by operation on argon plasma maintenance gas only.

Then, the first substrate was moved into position in front of the source, and exposed to a beam of argon ions to sputter-etch the surface for approximately 10 to 20 seconds. Then, the hydrocarbon precursor gas was added, and the ion source parameters were adjusted to the desired settings for deposition of DLC. The DLC deposition process was then continued for a time of 15 seconds to 20 minutes to achieve the final thickness values shown in Tables 1 and 2. No adhesion layer between the substrate and the DLC coatings was used.

After completion of the deposition of DLC on the first substrate, the substrate was rotated out of the ion beam while the ion beam remained on and the precursor gas was still flowing; i.e. the ion source was still depositing DLC. (Note that the ion beam was never started or stopped when the substrate was in front of the source; i.e. the substrate was continually exposed to the ion beam when it was in front of the ion source.) Then, the precursor gas flow was shut off and an argon ion beam was reestablished without shutting off the ion source plasma. Then, the next substrate was rotated into the argon ion beam, and the aforementioned process steps for sputter-etching and DLC deposition were repeated.

The results of the DLC deposition runs with 1,3-butadiene precursor gas and acetylene precursor gas are summarized in and Table 2, respectively below. All DLC coatings in Tables 1 and 2 were deposited onto Si wafer substrates, except for Run #395-8 (Table 1) in which the substrate was a magnetic disk.

The results in Table 1 show that the process of the present invention utilizing 1,3-butadiene precursor gas is capable of depositing DLC coatings at a deposition rate up to at least 47 Å per second, and hardness up to at least 22.5 GPa. The results in Table 2 show that the process of the present invention utilizing acetylene precursor gas is capable of depositing DLC coatings at a deposition rate up to at least 35 Å per second, and hardness up to at least 26.6 GPa. The deposition rate would be even greater if the distance between the ion source and the substrate was further reduced, or if higher flow rates of hydrocarbon precursor gas were utilized (see FIG. 4). Higher deposition rates were not explored in the matrix of tests in Table 1 because the achieved deposition rates were sufficient for production coating of magnetic disks.

TABLE 1

| Run | A(I) | A(V) | Pres. | M(I) | B fld. | HC | Cnfg. | Ar | Dist. | Thk. | GPk. | Slope | Stress | Hard. | Rate |
|---|---|---|---|---|---|---|---|---|---|---|---|---|---|---|---|
| 395-8* | 10 | 58 | 1.43 | 2 | 40 | 30 | OUT | 23 | 7 | 304 | 1511 | 22.8 | — | — | — |
| 361-5 | 10 | 72 | 0.37 | 0.8 | 16 | 30 | OUT | 25 | 7 | 3215 | 1558 | 1.2 | 2.8 | 19.8 | 18 |
| 364-3 | 10 | 86 | 0.44 | 4 | 80 | 30 | OUT | 40 | 7 | 3755 | 1583 | −0.8 | 3.5 | 22.5 | 21 |
| 364-5 | 10 | 97 | 0.43 | 4 | 80 | 30 | OUT | 35 | 7 | 3650 | 1578 | −0.6 | 3.1 | 22.2 | 21 |
| 368-10 | 10 | 73 | 0.49 | 4 | 80 | 60 | IN | 25 | 7 | 7100 | 1539 | 2.3 | 2.0 | 17.6 | 47 |
| 393-6 | 10 | 83 | 1.18 | 4 | 80 | 30 | IN | 11 | 7 | 3900 | 1528 | 3.7 | 1.9 | 16.1 | 26 |
| 393-10 | 12 | 81 | 0.79 | 4 | 80 | 30 | IN | 25 | 7 | 5000 | 1541 | 2.7 | 1.8 | 11.9 | 33 |
| 394-10 | 10 | 51 | 1.40 | 2 | 40 | 30 | OUT | 50 | 7 | 2700 | 1519 | 5.9 | 1.4 | 12.8 | 19 |
| 395-2 | 10 | 61 | 1.43 | 4 | 80 | 30 | OUT | 50 | 7 | 4000 | 1534 | 3.2 | 1.8 | 14.3 | 22 |

TABLE 2

| Run | A(I) | A(V) | Pres. | M(I) | B fld. | HC | Cnfg. | Ar | Dist. | Thk. | GPk. | Slope | Stress | Hard. | Rate |
|---|---|---|---|---|---|---|---|---|---|---|---|---|---|---|---|
| 402-2 | 10 | 80 | 0.29 | 2 | 40 | 40 | IN | 15 | 7 | 3800 | 1546 | 0.15 | 4.6 | 24.6 | 11 |
| 404-10 | 5 | 84 | 1.07 | 5 | 100 | 40 | IN | 15 | 7 | 3600 | 1532 | 0.86 | 1.8 | 16.7 | 15 |
| 411-2 | 8 | 86 | 1.04 | 6 | 120 | 40 | IN | 15 | 4 | 4500 | 1547 | 0.7 | 0.8 | 12.5 | 21 |
| 414-10 | 8 | 87 | 0.37 | 6 | 120 | 40 | SIDE | 30 | 4 | 3500 | 1564 | 1.4 | 3.9 | 26.6 | 35 |
| 418-2 | 8 | 89 | 0.90 | 6 | 120 | 20 | IN | 17 | 7 | 3900 | 1544 | 1.4 | 3.4 | 21.2 | 8 |
| 420-8 | 8 | 94 | 1.02 | 6 | 120 | 60 | IN | 17 | 7 | 4100 | — | — | 2.6 | 20.1 | 26 |
| 424-10 | 8 | 87 | 1.03 | 10 | 200 | 40 | IN | 55 | 7 | 4700 | — | — | 3.7 | 25.1 | 20 |
| 491-10 | 12 | 92 | 0.65 | 9 | 260 | 20 | IN | 110 | 14 | 2700 | — | — | 4.8 | 25.0 | 2.3 |
| 496-2 | 12 | 86 | 0.80 | 9 | 260 | 30 | IN | 140 | 14 | 3800 | — | — | 4.8 | — | 32 |
| 501-2 | 10 | 80 | 0.46 | 4.5 | 150 | 20 | IN | 60 | 7 | 1800 | — | — | 6.1 | — | 6 |

Notes for Tables 1 and 2 above and Tables 3, 4, 5 and 6 below:
A(I) = anode current in Amps;
A(V) = anode voltage in Volts;
M(I) = magnet current in Amps;
Pres. = chamber pressure in milliTorr;
B fld. = magnetic field in Gauss;
HC = hydrocarbon precursor flow rate in sccm;
Ar = argon plasma maintenance gas flow rate in sccm;
Cnfg. = Nozzle configuration;
Dist. = distance between ion source and substrate;
Thk. = DLC coating thickness in Å;
Gpk. = Raman G-peak position in wavenumbers ($cm^{-1}$);
Slope = Raman luminescence slope;
Stress = Compressive stress in GPa;
Hard. = Nanoindentation hardness in GPa;
Rate = DLC deposition rate in Å/second
* = substrate was a magnetic disk.

Example H

The same ion source used in Example G was used to deposit DLC coatings, but via pulsed deposition mode in which the carbon-containing deposition flux was turned on and off repeatedly during deposition. The carbon-containing deposition flux was pulsed on and off either by (i) pulsing the anode power supply with argon plasma maintenance gas and hydrocarbon precursor gas continuously flowing, or (ii) pulsing the hydrocarbon precursor gas flow with the plasma maintenance gas continuously flowing and the anode power supply continuously on.

The deposition runs summarized in Table 3 utilized the following process parameters for the deposition of DLC coatings:

(a) magnet current of 6 Amps;

(b) magnetic field of 120 Gauss;

(c) nozzle configuration in the IN position;

(d) acetylene as the hydrocarbon precursor gas;

(e) deposition flux pulsed 5 seconds on, then 5 seconds off;

(f) distance between source and substrate of 7 inches.

For the deposition runs on Si wafer substrates, the thickness of the DLC coatings was in the range of about 3500 Å to 6100 Å, which allowed for characterization of mechanical properties such as compressive stress and Nanoindentation hardness. The thickness of the DLC coatings in the deposition runs on magnetic disks wafers was in the range of 400 Å to 800 Å, which was chosen for ease of Raman spectroscopy characterization of the DLC material while maintaining good adhesion of the DLC coatings to the magnetic disk substrates.

Referring to Table 3 below, material properties of the DLC in Run 416-8 on the disk substrate are presumed to be the same as those of Run 416-6 on the Si wafer substrate, because with the exception of process time, the run conditions were the same. Further, the material properties of the DLC in Run 416-12 on the disk substrate are presumed to be the same as those of Run 416-10 on the Si wafer substrate, because with the exception of process time, the run conditions were the same. However, it is pointed out that because of the increased length of the deposition time on the Si substrates relative to that for the magnetic disk substrates, the wafer substrate temperature was probably higher, which may result in a slight change of material properties.

the anode (plasma) power supply works. The ion source of the present invention has been found to operate in a very stable mode, with minimum change in discharge conditions in the pulsed precursor gas mode, especially when the vacuum chamber pressure was in the range of about 0.8 milliTorr or greater. Pulsing the precursor gas also tends to produce a harder DLC coating than pulsing the plasma power supply. Typically, it has been found that for the deposition methods described in Examples G and H the DLC hardness produced by the pulsed anode current method is somewhat lower than that obtained by continuous operation, and the DLC hardness produced by the pulsed precursor gas method is somewhat higher than that obtained by continuous operation. For reference, see Run 418-2 in Table 2 and Runs 418-6 and 418-10 in Table 3.

Example I

DLC coatings of thickness in the range of about 50 to 70 Å were deposited on 95 mm diameter magnetic hard disks in pass-by mode using the ion source and substrate fixturing configuration of Example G. The substrates were prepared by a standard manufacturing process used to make commercial hard disks, except that the process was interrupted prior to the application of the standard magnetron sputtered carbon overcoat.

Multiple magnetic disks were loaded onto a rotating fixture and coated with DLC in pass-by mode via the following procedure. In the setup position with no substrate in front of the ion source, the ion source plasma and ion beam were first stabilized by operation on argon plasma maintenance gas only. Then, the fixture rotation was turned on and the disks were continuously moved past the source. Once each disk had passed by the source a predetermined number of times to complete a sputter-etching process to remove residual surface contaminants and activate the surface, the rotation was stopped so that a setup position, containing no disk substrate, was present over the source. Then, hydrocarbon precursor gas was introduced into the ion source and the ion source parameters were allowed to stabilize. Once the source parameters became stable, the substrate fixture rotation was started again, and the disk substrates received a DLC coating. The desired DLC thickness was obtained by rotating the substrates past the ion source for a predetermined number of revolutions.

The DLC deposition runs, summarized in Table 4 below, utilized 1,3-butadiene as the hydrocarbon precursor gas. The distance between the source and disk substrate was 7 inches.

TABLE 3

| Run | Sub | A(I) | A(V) | Pres. | HC | Ar | Thk. | GPk. | Slope | Stress | Hard. | Rate |
|---|---|---|---|---|---|---|---|---|---|---|---|---|
| 418-6 | Si | 8, P | 92 | 0.9 | 20 | 17 | 5900 | 1541 | 1.3 | 3.2 | 20.8 | 12 |
| 418-10 | Si | 8 | 90 | 0.9 | 20, P | 17 | 3800 | 1554 | 1.6 | 3.6 | 22.5 | 8 |
| 416-6 | Si | 8,P | 88 | 1.0 | 40 | 20 | 6100 | 1535 | 1.2 | 2.3 | 18.4 | 25 |
| 416-8 | disk | 8, P | 86 | 1.0 | 40 | 20 | 759 | — | — | — | — | — |
| 416-10 | Si | 8 | 86 | 0.99 | 40, P | 20 | 3500 | 1548 | 1.5 | 3.2 | 21.8 | 15 |
| 416-12 | disk | 8 | — | 0.99 | 40, P | 20 | 442 | — | — | — | — | — |

Additional notes for Table 3:
Sub = substrate type;
P = parameter was pulsed on and off.

As illustrated by the results presented in Table 3, it was found that both methods for pulsing the deposition flux produced DLC coatings with outstanding characteristics such as high hardness and high deposition rate. Generally, it has been found that the simplest method for operation of the ion source in the pulsed deposition mode for disk coating is by pulsing the hydrocarbon precursor gas, however pulsing After application of the DLC coating, the disks received standard post-deposition processing steps of burnishing and Tubing. Selected disks were then tested to verify the performance of these ultrathin DLC coatings of the present invention. The disks coated in each of the runs summarized in Table 4 below all passed 20,000 CSS cycles under ambient conditions, and 10,000 CSS cycles under aggressive conditions of elevated temperature, e.g. 55° C., and low humidity, i.e. 5%, indicating outstanding performance. The performance of these disks coated with about 50 to 70 Å of DLC by the process of the present invention was greatly superior to that obtained with magnetron sputtered carbon overcoats. Also, the thickness non-uniformity of these DLC coatings was +/−5% or better, which is outstanding and meets or exceeds the criteria for protective overcoats on magnetic hard disks.

TABLE 4

| Run | A(I) | A(V) | Pres. | M(I) | B fld. | HC | Cnfg. | Ar | Thk. | Unif. |
|-----|------|------|-------|------|--------|-----|-------|-----|------|-------|
| 356 | 10 | 64 | 0.50 | 3 | 60 | 30 | OUT | 50 | 49 | 3.7 |
| 357 | 10 | 71 | 0.51 | 4 | 80 | 30 | OUT | 50 | 58 | 5.6 |
| 358 | 10 | 57 | 0.52 | 2 | 40 | 30 | OUT | 50 | 48 | 2.9 |
| 359 | 10 | 56 | 0.51 | 2 | 40 | 30 | OUT | 50 | 52 | 4.3 |
| 379 | 10 | 58 | 0.50 | 2 | 40 | 30 | OUT | 50 | 52 | 3 |
| 380 | 10 | 58 | 0.50 | 2 | 40 | 30 | OUT | 50 | 66 | 3 |
| 382 | 10 | 83 | 0.38 | 4 | 80 | 30 | IN | 25 | 47 | 5 |
| 383 | 10 | 84 | 0.38 | 4 | 80 | 30 | IN | 25 | 68 | 5 |
| 385 | 10 | 75 | — | 4 | 80 | 60 | IN | 25 | 51 | 5 |
| 386 | 10 | 74 | 0.50 | 4 | 80 | 60 | IN | 25 | 71 | 4 |
| 389 | 7 | 80 | 0.37 | 4 | 80 | 30 | IN | 25 | 47 | 5 |
| 390 | 7 | 80 | 0.36 | 4 | 80 | 80 | IN | 30 | 66 | 5 |

Additional note for Table 4:
Unif. = thickness non-uniformity (±%) across area of substrate surface between outer diameter and 2 inches radially inward from outer diameter. Reported values were measured in set-up runs on Si wafers.

Example J

DLC coatings of thickness in the range of about 50 to 70 Å were prepared on 95 mm diameter magnetic hard disks as described in Example I, but the deposition was carried out in pulsed static mode.

There were multiple disks mounted on the fixture in each run, but each disk in a run was sequentially coated in the pulsed mode. Two different processes of the pulsed mode were tested.

In the first pulsed mode process (see Runs 426, 428, 431, 433 in Table 5 below), the DLC deposition was started and stopped only by pulsing the flow of precursor gas while the ion source remained operating with argon plasma maintenance gas. In the setup position with no substrate in front of the ion source, the ion source plasma and ion beam were first stabilized by operation on argon plasma maintenance gas only. Then, a disk substrate was rotated into position in front of the ion source. Next, the hydrocarbon precursor gas was pulsed on, and remained on for a time sufficient to deposit a DLC coating with target thickness between 50 Å and 70 Å. After completion of this deposition time, the precursor gas flow was turned off. Then, the disk was moved to a position away from the source. The same process as noted above was continued on other substrates.

In the second pulsed mode process (see Runs 427, 429, 432, 434 in Table 5), the DLC deposition was started by pulsing on the flow of precursor gas while the ion source remained operating with argon plasma maintenance gas, but the deposition was stopped by turning off the anode power supply to extinguish the ion source plasma. In the setup position with no substrate in front of the ion source, the ion source plasma and ion beam were first stabilized by operation on argon plasma maintenance gas only. Then, the disk was rotated into position in front of the ion source. Next, the hydrocarbon precursor gas was pulsed on, and remained on for a time sufficient to deposit a DLC coating with target thickness between 50 Å and 70 Å. After completion of this deposition time, the anode power supply was turned off to extinguish the ion source plasma and the ion beam. Then, the disk was moved to a position away from the source. The source was restarted on argon plasma maintenance gas as noted above, and the same process was continued on other substrates.

The DLC deposition runs summarized in Table 5 below utilized 1,3-butadiene or acetylene as the hydrocarbon precursor gas. The distance between the source and disk substrate was 7 inches.

After application of the DLC coating, the disks received standard post-deposition processing steps of burnishing and Tubing. Disks coated in each of the runs summarized in Table 5 passed 20,000 CSS cycles under ambient conditions, and 10,000 CSS cycles under aggressive conditions of elevated temperature and low humidity, indicating outstanding performance. As in Example I, it was found that the performance of these disks coated with about 50 to 70 Å of DLC by the process of the present invention was greatly superior to that obtained with magnetron sputtered carbon overcoats of similar thickness.

TABLE 5

| Run | Mode | A(I) | A(V) | M(I) | B fld. | Gas | HC | Cnfg. | Ar | Thk. |
|-----|------|------|------|------|--------|-----|-----|-------|-----|------|
| 426 | PG | 5 | 82 | 5 | 100 | A | 40 | IN | 15 | 58 |
| 427 | Cur | 5 | 81 | 5 | 100 | A | 40 | IN | 15 | 47 |
| 428 | PG | 8 | 87 | 6 | 120 | A | 40 | IN | 20 | 64 |
| 429 | Cur | 8 | 84 | 6 | 120 | A | 40 | IN | 20 | 54 |
| 431 | PG | 7 | 66 | 4 | 80 | B | 30 | IN | 25 | 65 |
| 432 | Cur | 7 | 67 | 4 | 80 | B | 30 | IN | 25 | 53 |
| 433 | PG | 8 | 83 | 6 | 120 | B | 30 | IN | 25 | 67 |
| 434 | Cur | 8 | 83 | 6 | 120 | B | 30 | IN | 25 | 59 |

Additional notes for Table 5:
Mode = method of pulsing;
Cur = pulsed anode current mode;
PG = pulsed precursor gas mode;
Gas = hydrocarbon precursor gas;
A = acetylene;
B = 1,3-butadiene.

Example K

Closed-drift Hall Current ion sources, similar to the source used in Example G were used to deposit DLC coatings as the protective layer on magnetic disks using a fully automated manufacturing process in an Intevac MDP-250B production magnetic disk coating system. The ion sources were flange-mounted as illustrated in FIG. 2. In the standard configuration, the Intevac MDP-250B system utilized three separate chamber stations to deposit a magnetron sputtered carbon overcoat as the protective layer on magnetic disks as they passed through the machine. Each station housed two opposing magnetron cathodes, which were configured to simultaneously coat both sides of each magnetic disk. Because of the low deposition rate of magnetron sputtered carbon, three sputter deposition stations were necessary to meet the high production throughput requirements of the machine.

The magnetron sputtering sources and related support equipment were removed from the three stations on the machine. On one station, two flange-mounted Hall-Current ion sources of the present invention were mounted in place of the magnetron sputtering sources, resulting in a configuration as in FIG. 3, so that both sides of the disk were simultaneously coated with ion beam DLC. This station was also modified to add an additional port for pumping by a 2,000 l/second turbopump.

The entire disk coating process involved:
a) loading a cassette of disks that sequentially entered the first of the 12 process stations though a load-lock;
b) movement of the disk to a station where it was heated;
c) movement of the disk to a station where a metallic seed layer was deposited by magnetron sputtering;
d) movement of the disk to a station where a magnetic storage layer was deposited by magnetron sputtering;
e) movement of the disk to the station where ion beam DLC was deposited using the process of the present invention; and
f) movement of the disk to the exit station through another load-lock to a loading cassette.

During the ion beam DLC coating process, argon plasma maintenance gas was continuously flowed through source during the entire process cycle which involved (1) disk transfer into the DLC coating station from the previous station, (2) DLC deposition, and (3) disk transfer out of the DLC station into the next station. When the disk was positioned in the DLC deposition station and the DLC station was isolated from the rest of the stations, DLC deposition was performed by flowing $C_2H_2$ gas through nozzles in front of the source for a predetermined time to achieve the desired DLC coating thickness. No adjustments were made to other source parameters when the $C_2H_2$ was introduced except in a few cases when the Ar plasma maintenance gas was also lowered slightly. This process was essentially the equivalent of the "first pulsed mode process" described in Example J.

DLC coatings were deposited on disks for CSS testing using the following conditions in each source:
a) anode current of 8 Amps;
b) magnet current of 2 to 6 Amps;
c) magnetic field of 40 to 120 Gauss;
d) acetylene precursor flow rate of 30 to 40 sccm;
e) argon plasma maintenance gas flow rate of 7 to 25 sccm;
f) chamber pressure during deposition of 1.1 to 1.7 milliTorr;
g) DLC deposition rate of 10 to 21 Å/second.

Magnetic disks coated with 50 Å ion beam DLC made under eight different conditions within and including the ends of these ranges, each passed 20,000 CSS test cycles under ambient conditions and a 10,000 CSS test cycles under aggressive conditions of elevated temperature and low humidity, indicating outstanding performance.

To measure hardness of the DLC coatings made in this way, 4000 Å thick DLC coatings were deposited on silicon substrates in a similar process to that used for the magnetic disks, except the heat and metal layer processes were not performed prior to the DLC coating. DLC coatings were deposited using the following conditions in each source:
a) anode current of 2 to 15 Amps;
b) magnet current of 2 to 8.5 Amps;
c) magnetic field of 45 to 250 Gauss;
d) acetylene precursor gas flow rate of 15 to 45 sccm;
e) argon plasma maintenance gas flow rate of 12 to 63 sccm;
f) chamber pressure during deposition of 1.6 to 4.1 milliTorr;

The Nanoindentation hardness of the resulting DLC films was in the range of 11 to 17 GPa.

Example L

The same Hall-Current ion source used in Example A was used to deposit DLC coatings by operating the ion source with argon and acetylene gases. In this example, however, the anode and electromagnet of the ion source were powered by means of separate DC power supplies. The deposition conditions and results are presented in Table 6. The DLC deposition runs summarized in Table 6 were all performed on silicon wafer substrates, using acetylene as the hydrocarbon precursor gas, and nozzle configuration in the IN position.

The results in Table 6 below show that the process of the present invention utilizing separate DC power supplies for the anode and electromagnet of the ion source is capable of depositing DLC coatings at a deposition rate up to at least 23 Å per second, hardness up to at least 29.8 GPa, and compressive stress up to at least 6.2 GPa. The deposition rate would be even greater if the distance between the ion source and the substrate was decreased to less than 7 inches, or if higher flow rates of hydrocarbon precursor gas were utilized (see FIG. 4).

TABLE 6

| Run | A(I) | A(V) | Pres. | M(I) | B fld. | HC | Ar | Dist. | Thk. | Stress | Hard. | Rate |
|---|---|---|---|---|---|---|---|---|---|---|---|---|
| 497-2 | 12 | 85 | 0.84 | 6 | 300 | 20 | 150 | 14 | 4190 | 5.1 | — | 2.3 |
| 497-10 | 12 | 90 | 1.05 | 9 | 400 | 20 | 200 | 14 | 4185 | 4.9 | — | 2.3 |
| 501-6 | 10 | 80 | 0.74 | 4.5 | 240 | 20 | 120 | 7 | 3000 | 6.2 | 28.6 | 10 |
| 502-2 | 10 | 85 | 0.76 | 6 | 300 | 20 | 130 | 7 | 3800 | 2.6 | 7.7 | 12.7 |
| 502-6 | 10 | 86 | 0.93 | 7.5 | 360 | 20 | 170 | 7 | 3000 | 1.9 | 8.0 | 10 |
| 502-10 | 10 | 86 | 1.07 | 9 | 400 | 20 | 200 | 7 | 3750 | 2.0 | 9.8 | 12.5 |
| 503-2 | 10 | 85 | 0.38 | 1.5 | 85 | 20 | 50 | 7 | 1875 | 5.5 | — | 6.3 |
| 503-6 | 10 | 84 | 0.52 | 3 | 170 | 20 | 80 | 7 | 2400 | 6.1 | — | 8 |
| 503-10 | 10 | 83 | 0.71 | 4.5 | 240 | 20 | 116 | 7 | 3100 | 4.5 | 17.2 | 10.3 |
| 504-2 | 10 | 87 | 0.73 | 6 | 300 | 30 | 120 | 7 | 5150 | 2.5 | — | 17.2 |
| 504-6 | 10 | 86 | 0.96 | 7.5 | 360 | 30 | 170 | 7 | 5300 | 2.7 | — | 17.7 |
| 504-10 | 10 | 85 | 1.14 | 9 | 400 | 30 | 210 | 7 | 5600 | 2.3 | — | 18.7 |
| 505-2 | 10 | 87 | 0.44 | 3 | 170 | 10 | 60 | 7 | 900 | 5.7 | — | 3 |
| 505-6 | 10 | 86 | 0.80 | 6 | 300 | 10 | 130 | 7 | 2600 | 1 | — | 8.7 |
| 505-10 | 10 | 85 | 1.15 | 9 | 400 | 10 | 200 | 7 | 3300 | 0.86 | — | 11 |
| 506-2 | 10 | 87 | 0.49 | 3 | 170 | 40 | 65 | 7 | 4500 | 4.8 | 29.8 | 18.8 |
| 506-6 | 10 | 87 | 0.79 | 6 | 300 | 40 | 130 | 7 | 5300 | 5.3 | 28.3 | 22.1 |
| 506-10 | 10 | 87 | 1.10 | 9 | 400 | 40 | 200 | 7 | 5550 | 4.8 | 25.5 | 23.1 |

Example M

A non-closed drift Hall-Current ion source having a linear anode configuration, similar to that shown in FIG. 4A of the Mahoney et al. co-pending patent application U.S. Ser. No.

08/901,036 was used to deposit DLC coatings. The anode was about 30 inches long, and the anode channel was approximately 0.5 inch deep and 0.5 inch wide. Twenty-eight electromagnet coils operated on 60 cycle AC current were used to induce a magnetic field across the anode between the two magnetic poles that extended along each side of the anode. The ends of the anode channel were closed off with an insulating material. Argon plasma maintenance gas was fed from the back of the source and emerged through the shadowed anode gap along the center line of the anode. Two hollow cathode electron sources, mounted near the ends of the anode, were used to supply the electrons to maintain the plasma. For the DLC deposition, acetylene precursor gas was introduced into the ion beam via 4 nozzles mounted along the length of the anode channel. Each nozzle directed a stream of precursor gas across the ion beam approximately perpendicular to the long dimension of the anode. The nozzles were mounted approximately 7 inches apart and were spaced approximately 0.25 inch downstream of the face of the ion source.

The long dimension of the ion source was mounted in a vertical orientation, and the ion beam was directed horizontally at four 4-inch diameter Si wafer substrates. The substrates were placed about 7 inches downstream from the front of the ion source and parallel to the face of the source. The center of each substrate wafer lined up directly in front of the center of the anode channel and directly in front of one of the four hydrocarbon nozzles.

After mounting the substrates in the vacuum chamber, the chamber was evacuated to pressure of less than $1 \times 10^{-5}$ Torr. The ion source plasma was initiated on argon and allowed to stabilize. Then, DLC deposition was initiated by flowing 10 sccm of acetylene precursor gas through each nozzle.

A DLC coating was deposited onto the substrates in Run #1014L using the following conditions: anode voltage between 100 and 111 Volts; anode current of 40 Amps; magnet current of 4 Amps through each of the 28 electromagnets, magnetic field of approximately 150 Gauss; argon plasma maintenance gas flow rate of 140 sccm, total acetylene precursor gas flow rate of 40 sccm; chamber pressure during deposition of approximately 1.6 mTorr; deposition time of 4 minutes. Upon completion of the deposition, the vacuum chamber was vented, and the DLC-coated substrate was recovered.

The maximum thickness of the DLC coating was 1645 Å, corresponding to a deposition rate of approximately 7 Å per second. The coating compressive stress was between about 3 and 3.8 GPa. The film was too thin to obtain accurate Nanoindentation hardness measurements, but based on the known correlation between compressive stress and hardness for other DLC films deposited from acetylene precursor gas with Hall-Current ion sources of the present invention, the coating hardness was expected to be in the range of about 19 to 23 GPa.

This example demonstrated that a non-closed drift Hall-Current ion source of the present invention, having a linear anode configuration was able to deposit DLC coatings having high hardness at high deposition rate.

Using other process conditions, e.g. higher precursor gas flow rate, different nozzle geometries, lower anode voltage, but with the same ion source operated with acetylene precursor gas, it was found that soft DLC coatings having compressive stress as low as 0.12 GPa, with expected hardness less than 5 GPa were deposited.

Example N

DLC coatings were ion beam deposited using the linear anode, non-closed drift Hall-Current ion source of Example M, except that both the argon plasma maintenance gas and the acetylene precursor gas were both introduced through the shadowed anode gap directly into the plasma discharge. The 4-inch diameter Si wafer substrates were placed about 7 inches downstream from the front of the ion source and parallel to the face of the source.

In Runs #1097L and #1102-1107L, DLC coatings were deposited using the following conditions: anode voltage between 93 and 103 Volts; anode current in the range of 36 to 40 Amps; magnet current of 4 to 8 Amps through each of the 28 electromagnets; magnetic field of approximately 150 to 300 Gauss; argon plasma maintenance gas flow rate of 180 to 200 sccm; acetylene precursor gas flow rate of 50 to 60 sccm; chamber pressure during deposition of approximately 1.8 to 1.9 mTorr.

The resulting DLC coatings had thickness in the range of 1980 to 5200 Å, corresponding to deposition rates in the range of approximately 3 to 9 Å per second. The compressive stress of the coatings was in the range of 1 to 3.8 GPa, and the Nanoindentation hardness of the coatings was in the range of 13 to 22 GPa.

In Run #1120L, the deposition conditions were similar, but the distance between the source and substrates was reduced from 7 inches to 6 inches. The compressive stress of the DLC coating deposited was 4.5 GPa, with anticipated hardness of about 25 GPa.

This example demonstrated that the non-closed drift Hall-Current ion source of the present invention, having a linear anode configuration was able to deposit DLC coatings having high hardness at high deposition rate by introducing the precursor gas through the shadowed anode gap directly into the plasma discharge.

Examples A–N above demonstrate the unexpectedly high rate of deposition (typically greater than 10 Å per second) of very hard (greater than 10 GPa) DLC and Si-DLC coatings using the Hall-Current ion source process of the present invention. The prior art suggests that such high hardness materials require an ion beam deposition system which delivers 100 eV per C atom deposited. As an example, in accordance with M. Weiler et al., one would expect an ion beam with mean beam energy of 150 to 250 eV would be required to deposit very hard DLC coatings from acetylene, which in a low pressure plasma state principally forms $C_2H_x+$ions. However, the preceding examples show that high hardness DLC and Si-DLC coatings can be formed with the high density ion beams formed by the process of the present invention with mean time-averaged energies that are substantially lower than the 100 eV per C atom criterion. The preceding examples also illustrate the ability of the unique Hall-Current ion source apparatus to deposit very hard DLC coatings at high rates in a manner that cannot be deduced from prior art gridless Hall-Current ion sources and related teachings. The characteristics of high deposition rate and high coating hardness make the process of the present invention ideal for the production of thin DLC and Si-DLC coatings for key industrial applications including: data storage or recording media such as magnetic hard disks, floppy disks and magnetic tape; magnetic transducers used in magnetic recording such as magnetoresistive sliders and tape heads; optical data storage disks utilizing phase-change media; production of barrier coatings for packaging, pharmaceutical and chemical applications; antireflection, filter and bandpass optical coatings; and wear-resistant, corrosion-resistant, and abrasion-resistant protective coatings for a variety of substrates consisting of metal, ceramic, glass, plastics and their combinations.

Without departing from the scope of this invention, one of ordinary skill in the art can make various changes and modifications to the invention to adapt it to various usages and conditions. As such these changes and modifications are properly, equitably and intended to be, within the full range of equivalents of the following claims.

What is claimed is:

1. A method of depositing a diamond-like carbon (DLC) coating onto the surface of a substrate using a Hall-Current ion source comprising the steps of:
   (a) mounting said substrate in a deposition vacuum chamber containing said Hall-Current ion source and evacuating the air from said chamber;
   (b) supplying an inert gas to at least one self-sustaining cathode electron source of said Hall-current ion source and exciting said cathode electron source to provide a supply of electrons to an anode of said Hall-Current ion source, said anode being electrically insulated from said vacuum chamber in such a manner to prohibit the formation of a plasma migrating into the interior of said Hall-Current ion source behind said anode;
   (c) introducing plasma maintenance gases through a gap of said anode and into an anode discharge region within said vacuum chamber and applying a voltage to provide an anode discharge current to flow between said anode and said electron source, wherein a magnetic field established by electromagnetic means is formed across said anode discharge region and electrons ionize the plasma maintenance gases to form a plasma beam of gas ions throughout said anode discharge region;
   (d) plasma ion beam depositing a layer of DLC from carbon-containing precursor gases using said plasma beam while thermally cooling said anode by cooling means other than by radiative thermal emission;
   (e) increasing the vacuum chamber pressure to atmospheric pressure; and
   (f) recovering a DLC-coated substrate product.

2. The method of claim 1 wherein said DLC layer is deposited at a rate greater than 5 Å per second.

3. The method of claim 1 wherein said DLC layer is deposited at a rate greater than 10 Å per second.

4. The method of claim 1 wherein said DLC layer is deposited at a rate greater than 10 Å per second and with a Nanoindentation hardness greater than 10 GPa.

5. The method of claim 1 wherein the anode discharge current flowing between said anode and said cathode electron source at least partially drives said electromagnetic means.

6. The method of claim 1 including alternating current circuit means for at least partially driving said electromagnetic means and for periodically reversing the direction of the lines of flux of the magnetic field of said electromagnetic means.

7. The method of claim 1 wherein the direction of the lines of flux of the magnetic field established by said electromagnetic means are substantially parallel to the surface of said anode at the second end of said anode discharge region.

8. The method of claim 1 wherein the direction of the lines of flux of the magnetic field established by said electromagnetic means diverge in a direction substantially the same as that of the plasma beam exiting said anode discharge region.

9. The method of claim 1 wherein said plasma maintenance gases are inert gases selected from the group consisting of argon, neon, krypton, xenon and mixtures thereof.

10. The method of claim 1 wherein said cathode electron source is disposed axisymmetrically with respect to said anode discharge region.

11. The method of claim 1 wherein said cooling means comprises an injector for directly contacting said anode with a cooling fluid.

12. The method of claim 1 wherein the plasma maintenance gases are substantially uniformly distributed through said gap in the anode from an injection means and into said anode discharge region and the resulting anode discharge current is substantially uniformly distributed adjacent to said gap.

13. The method of claim 1 for depositing materials onto substrates wherein the dimensions of the gap within said anode being at least greater than the characteristic Debye length of the local plasma formed near the gap in said anode and the shape of the gap being configured so as to substantially restrict line-of-sight deposition of coating onto said anode within said gap such that said anode discharge current is substantially maintained at said anode within the gap near a localized region of the plasma maintenance gases passing into said anode discharge region.

14. The method of claim 1 wherein a power supply is used to provide between about 500 to about 1000 volts to said electron source.

15. The method of claim 1 wherein said carbon-containing precursor gases are selected from the group consisting of methane, ethane, ethylene, butane, butadiene, acetylene, hexane, cyclohexane, and mixtures thereof.

16. The method of claim 15 wherein carbon-containing precursor gases also include an inert gas selected from the group consisting of helium, argon, neon, krypton, xenon and mixtures thereof.

17. The method of claim 16 wherein carbon-containing precursor gases also include a reactive gas selected from the group consisting of hydrogen, nitrogen, nitrogen-containing compounds, fluorine-containing compound and mixtures thereof.

18. The method of claim 2 wherein said DLC layer is deposited at a rate in the range of about 5 to about 200 Å per second and with a Nanoindentation hardness in the range of about 10 GPa to about 40 GPa.

19. The method of claim 1 wherein said substrate is selected from the group consisting of metals, semiconductors, ceramics, glasses, polymers, and mixtures thereof.

20. The method of claim 12 wherein a distributor means is included in said housing for introducing said precursor gases directly into the plasma beam and separately from that of said injection means for introducing plasma maintenance gases through said gap.

21. The method of claim 20 wherein said distributor means comprises at least one tube having a nozzle at one end for directing the precursor gases into said anode discharge region.

22. The method of claim 20 wherein said distributor means comprises at least one distributor ring for directing the deposition gas into said anode discharge region.

23. The method of claim 20 wherein said distributor means comprises at least one tube having a nozzle at one end for directing the precursor gases outside said anode discharge region.

24. The method of claim 20 wherein said distributor means comprises at least one distributor ring for directing the precursor gases outside said anode discharge region.

25. The method of claim 1 wherein the flow of said carbon-containing precursor gases is pulsed during the plasma ion beam deposition and said plasma maintenance gas continuously introduced through said gap.

26. The method of claim 1 wherein said carbon-containing precursor gases are continuously introduced during the plasma ion beam deposition and said anode discharge current is pulsed.

27. The method of claim 1 wherein said substrate contains data recording media.

28. The method of claim 1 wherein said substrate is a magnetic transducer used with magnetic recording media.

29. The method of claim 1 wherein said substrate is mounted in said deposition vacuum chamber so that both sides of the substrate are simultaneously coated with a layer of DLC.

30. The method of claim 1 wherein voltage is applied to said anode and to said electromagnetic means by separate DC power supplies.

31. A method of depositing a silicon-doped diamond-like carbon (Si-DLC) coating onto the surface of a substrate using a Hall-Current ion source comprising the steps of:

(a) mounting said substrate in a deposition vacuum chamber containing said Hall-Current ion source and evacuating the air from said chamber;

(b) supplying an inert gas to a self-sustaining cathode electron source of said Hall-current ion source and exciting said cathode electron source to provide a supply of electrons to an anode of said Hall-Current ion source, said anode being electrically insulated from said vacuum chamber in such a manner to prohibit the formation of a plasma migrating into the interior of said Hall-Current ion source behind said anode;

(c) introducing plasma maintenance gases through a gap of said anode and into an anode discharge region within said vacuum chamber and applying a voltage to provide an anode discharge current to flow between said anode and said electron source, wherein a magnetic field established by electromagnetic means is formed across said anode discharge region and electrons ionize the plasma maintenance gases to form a plasma beam of gas ions throughout said anode discharge region;

(d) plasma ion beam depositing a layer of Si-DLC from carbon-containing and silicon-containing precursor gases using said plasma beam while thermally cooling said anode by cooling means other than by radiative thermal emission;

(e) increasing the vacuum chamber pressure to atmospheric pressure; and (f) recovering a Si-DLC-coated substrate product.

32. The method of claim 31 wherein said carbon-containing and silicon-containing precursor gases are selected from the group consisting silane, disilane, methylsilane, dimethylsilane, trimethylsilane, tetramethylsilane (TMS), diethylsilane, and mixtures thereof.

33. The method of claim 31 wherein said Si-DLC coating is deposited at a rate greater than 5 Å per second and with a Nanoindentation hardness greater than 10 GPa.

34. The method of claim 31 wherein the anode discharge current flowing between said anode and said cathode electron source at least partially drives said electromagnetic means.

35. The method of claim 31 including alternating current circuit means for at least partially driving said electromagnetic means and for periodically reversing the direction of the lines of flux of the magnetic field of said electromagnetic means.

36. The method of claim 31 wherein the direction of the lines of flux of the magnetic field established by said electromagnetic means are substantially parallel to the surface of said anode at the second end of said anode discharge region.

37. The method of claim 31 wherein the direction of the lines of flux of the magnetic field established by said electromagnetic means diverge in a direction substantially the same as that of the plasma beam exiting said anode discharge region.

38. The method of claim 31 wherein said plasma maintenance gases are inert gases selected from the group consisting of argon, neon krypton, xenon and mixtures thereof.

39. The method of claim 31 wherein said cathode electron source is disposed axisymmetrically with respect to said anode discharge region.

40. The method of claim 31 wherein said cooling means comprises an injector for directly contacting said anode with a cooling fluid.

41. The method of claim 31 wherein the plasma maintenance gases are substantially uniformly distributed through said gap in the anode from an injection means and into said anode discharge region and the resulting anode discharge current is substantially uniformly distributed adjacent to said gap.

42. The method of claim 31 for depositing materials onto substrates wherein the dimensions of the gap within said anode being at least greater than the characteristic Debye length of the local plasma formed near the gap in said anode and the shape of the gap being configured so as to substantially restrict line-of-sight deposition of coating onto said anode within said gap such that said anode discharge current is substantially maintained at said anode within the gap near a localized region of the plasma maintenance gases passing into said anode discharge region.

43. The method of claim 31 wherein a power supply is used to provide between about 500 to about 1000 volts to said electron source.

44. The method of claim 32 wherein said precursor gases also include an inert gas selected from the group consisting of helium, argon, neon, krypton, xenon and mixtures thereof.

45. The method of claim 32 wherein said precursor gases also include a reactive gas selected from the group consisting of hydrogen, nitrogen, nitrogen-containing compounds, fluorine-containing compound and mixtures thereof.

46. The method of claim 31 wherein said Si-DLC layer is deposited at a rate in the range of about 10 to about 200 Å per second and with a Nanoindentation hardness in the range of about 10 GPa to about 40 GPa.

47. The method of claim 31 wherein said substrate is selected from the group consisting of metals, semiconductors, ceramics, glasses, polymers, and mixtures thereof.

48. The method of claim 31 wherein a distributor means is included in said housing for introducing said precursor gases directly into the plasma beam and separately from that of said injection means for introducing plasma maintenance gases through the gap.

49. The method of claim 48 wherein said distributor means comprises at least one tube having a nozzle at one end for directing the precursor gases into said anode discharge region.

50. The method of claim 48 wherein said distributor means comprises at least one distributor ring for directing the deposition gas into said anode discharge region.

51. The method of claim 48 wherein said distributor means comprises at least one tube having a nozzle at one end for directing the precursor gases outside said anode discharge region.

52. The method of claim 48 wherein said distributor means comprises at least one distributor ring for directing the precursor gases outside said anode discharge region.

53. The method of claim 31 wherein the flow of said silicon-containing precursor gases is pulsed during the plasma ion beam deposition and said plasma maintenance gas continuously introduced through said gap.

54. The method of claim 31 wherein said silicon-containing precursor gases are continuously introduced during the plasma ion beam deposition and said anode discharge current is pulsed.

55. The method of claim 31 wherein said substrate contains data recording media.

56. The method of claim 31 wherein said substrate is a magnetic transducer used with magnetic recording media.

57. The method of claim 31 wherein said substrate is mounted in said deposition vacuum chamber so that both sides of the substrate are simultaneously coated with a layer of Si-DLC.

58. The method of claim 31 wherein voltage is applied to said anode and to said electromagnetic means by separate DC power supplies.

* * * * *